US012586980B2

(12) United States Patent
Semenic et al.

(10) Patent No.: US 12,586,980 B2
(45) Date of Patent: Mar. 24, 2026

(54) THERMAL MANAGEMENT SYSTEM AND OPTICAL BENCH FOR DIODE LASER DEVICE

(71) Applicant: Teledyne Scientific & Imaging, LLC, Thousand Oaks, CA (US)

(72) Inventors: Tadej Semenic, Thousand Oaks, CA (US); Seongchul Jun, Newbury Park, CA (US); Avijit Bhunia, Newbury Park, CA (US); Weiya Zhang, Thousand Oaks, CA (US); Milind Mahajan, Thousand Oaks, CA (US); John Mansell, Thousand Oaks, CA (US); Kyle Gould, Los Angeles, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 955 days.

(21) Appl. No.: 17/643,895

(22) Filed: Dec. 13, 2021

(65) Prior Publication Data

US 2023/0187900 A1     Jun. 15, 2023

(51) Int. Cl.
H01S 5/024      (2006.01)
H01S 5/023      (2021.01)
H01S 5/02325    (2021.01)
H05K 7/20       (2006.01)
(52) U.S. Cl.
CPC .......... H01S 5/02423 (2013.01); H01S 5/023 (2021.01); H01S 5/02325 (2021.01); H01S 5/02476 (2013.01); H05K 7/20327 (2013.01)

(58) Field of Classification Search
CPC .... H01S 5/02423; H01S 5/023; H01S 5/0235; H01S 5/405; H01S 5/4012
See application file for complete search history.

(56) References Cited

U.S. PATENT DOCUMENTS

| | | | |
|---|---|---|---|
| 7,436,868 B2 | 10/2008 | Schulte et al. | |
| 8,432,945 B2 | 4/2013 | Faybishenko | |
| 9,768,584 B2 * | 9/2017 | Bandhauer | H01S 5/32316 |
| 11,769,843 B1 * | 9/2023 | Yap | H01L 31/02325 257/432 |
| 2004/0027631 A1 * | 2/2004 | Nagano | G02B 6/4249 372/36 |

(Continued)

*Primary Examiner* — Michael Carter
(74) *Attorney, Agent, or Firm* — K&L Gates LLP

(57) ABSTRACT

A thermo-optical ground plane includes a plate configured to mount a diode laser device defining a first surface area, an evaporation chamber in thermal communication with the plate, and a channel defined in thermal communication with the evaporation chamber. The channel is configured to receive and circulate a coolant fluid at a predetermined flowrate. The evaporation chamber is configured to receive a working fluid. The inner walls of the evaporation chamber define a second surface area that is greater than the first surface area of the diode laser device. The plate comprises beam shaping and folding optics for collimating and focusing the light from the diode laser device on an optical fiber. Light from a plurality of thermo-optical ground planes is combined on a single optical fiber. The structure enables cooling with exceptionally low coolant flowrate while also maintaining small specific volume and small specific weight.

30 Claims, 32 Drawing Sheets

(56) References Cited

U.S. PATENT DOCUMENTS

| 2009/0126922 | A1* | 5/2009 | Vetrovec | ................. | F21V 29/59 |
| | | | | | 257/E33.056 |
| 2013/0049041 | A1* | 2/2013 | Ramer | ................ | H01S 5/02423 |
| | | | | | 257/432 |
| 2022/0123519 | A1* | 4/2022 | Kanskar | .............. | H01S 5/02423 |

* cited by examiner

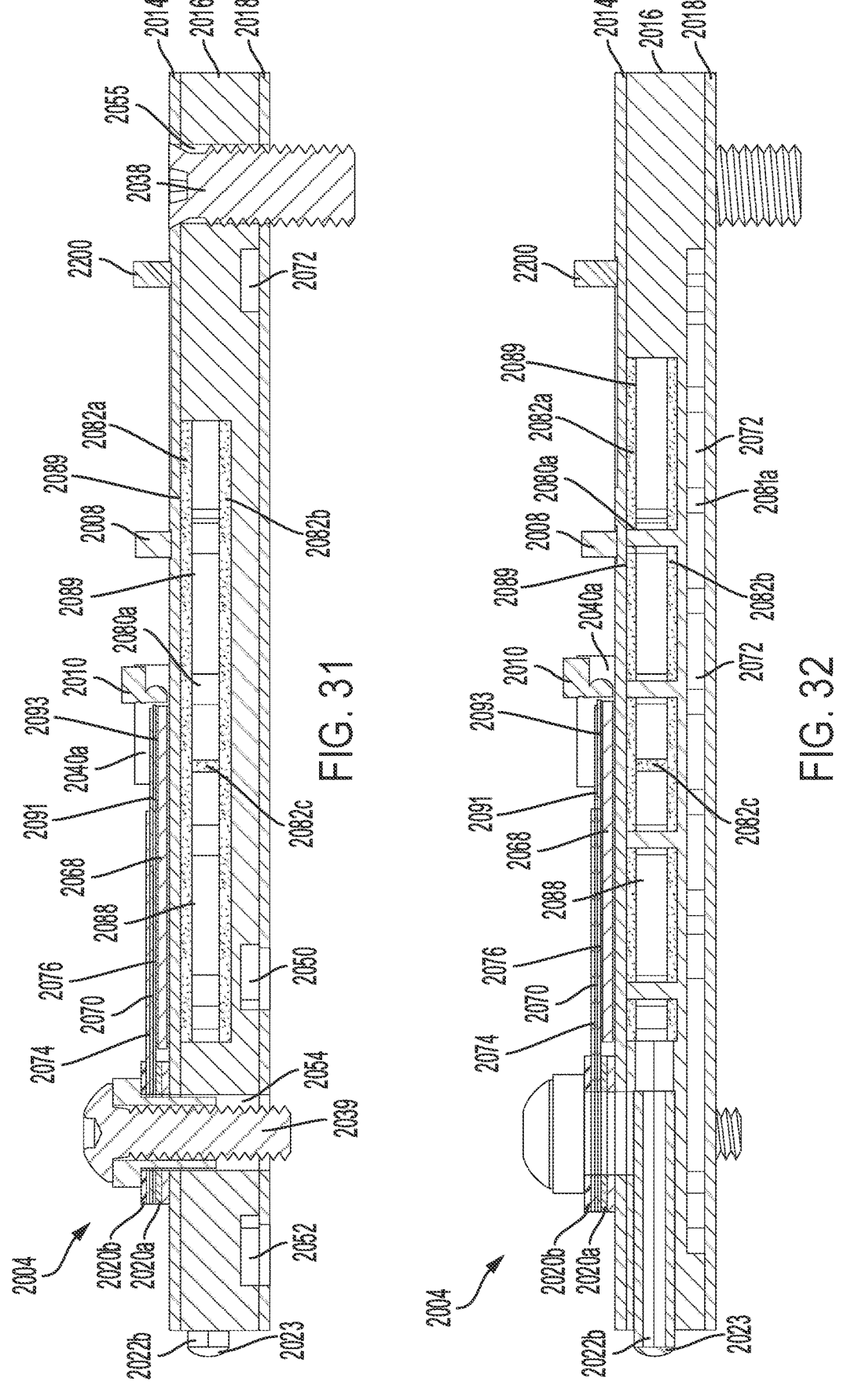

THERMAL MANAGEMENT SYSTEM AND OPTICAL BENCH FOR DIODE LASER DEVICE

BACKGROUND

In a high energy laser system, a large portion of the system is occupied by a Thermal Management System (TMS) to spread and remove the heat generated by the high energy laser system. A conventional TMS significantly increases the size and weight of the high energy laser system making it impractical for laser systems mounted on mobile platforms. A conventional TMS employs micro or mini-channel coolers to remove the heat from diode laser devices requiring a high flowrate of coolant and a high pressure drop across the coolant channel to pump the coolant at the high flowrate contributing to the large size and weight of the conventional TMS. Accordingly, there is a need for a new TMS for a high energy laser system having reduced size and weight, especially for high energy laser systems mounted on mobile platforms. A need also exists for a TMS for a high energy laser system with a coolant fluid channel that operates at a low flowrate to minimize the pressure drop across the coolant channel.

SUMMARY

In one aspect, the present disclosure provides a thermo-optical ground plane. The thermo-optical ground plane comprises a first plate configured to mount a diode laser device defining a first surface area; a second plate; a body positioned between the first and second plates, the body comprising a plurality of structural elements to support the first and second plates; an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant.

In another aspect, the present disclosure provides a diode pump module. The diode pump module comprises a plurality of thermo-optical ground planes, wherein each of the plurality of thermo-optical ground planes comprises: a first plate defining a first surface area, the first plate configured to mount a diode laser device defining a first surface area; a second plate; a body positioned between the first and second plates, the body comprising a plurality of structural elements to support the first and second plates; an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant; a diode laser device mounted on the first plate; and an optical device attached to the first plate, wherein the optical device is in optical communication with an output of the diode laser device; a flow manifold structure configured to connect each of the plurality of thermo-optical ground planes in a predetermined configuration to combine optical power from the plurality of diode laser devices and to couple the combined optical power to a single optical fiber, the flow manifold structure comprising: a manifold inlet tube configured to receive the coolant; a distribution manifold fluidically coupled to the manifold inlet and fluidically coupled to each channel of the plurality of thermo-optical ground planes; a return manifold fluidically coupled to each channel of the plurality of thermo-optical ground planes; and a common manifold outlet fluidically coupled to the return manifold.

In yet another aspect, the present disclosure provides a thermo-optical ground plane. The thermo-optical ground plane comprises a plate configured to mount a diode laser device defining a first surface area; an evaporation chamber in thermal communication with the plate, wherein the evaporation chamber is configured to receive a working fluid, and wherein inner walls of the evaporation chamber define a second surface area that is greater than the first surface area of the diode laser device; and a channel defined in thermal communication with the evaporation chamber, wherein the channel is configured to receive and circulate a coolant fluid at a predetermined flowrate.

FIGURES

The novel features of the described forms are set forth with particularity in the appended claims. The described forms, however, both as to organization and methods of operation, may be best understood by reference to the following description, taken in conjunction with the accompanying drawings in which:

FIG. 31 is a cross-sectional view of the thermo-optical ground plane shown in FIG. 28 taken through section 31-31.

FIG. 32 is a cross-sectional view of the thermo-optical ground plane shown in FIG. 28 taken through section 32-32 through a first tube.

DESCRIPTION

Figure 1:
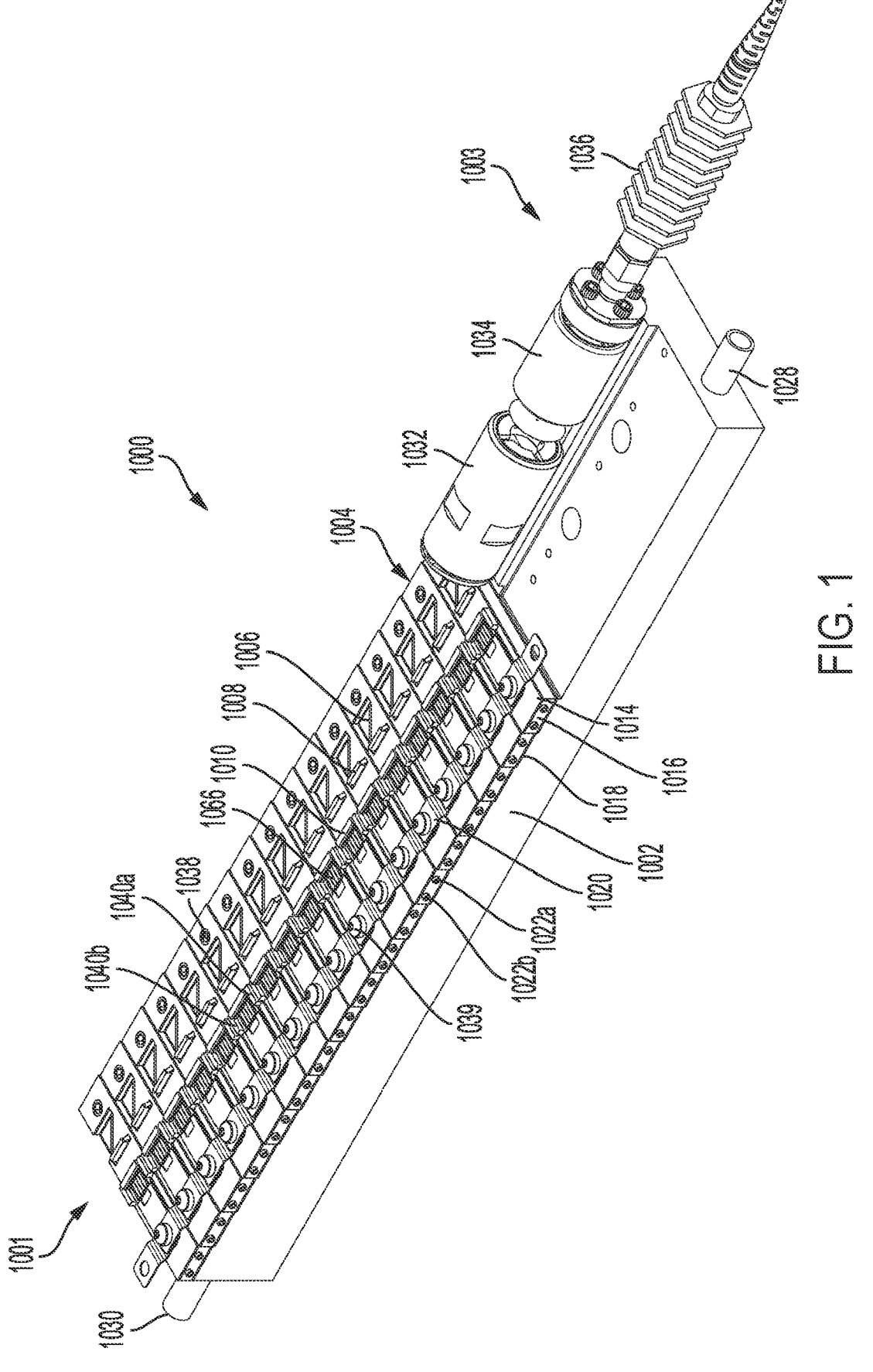
FIG. 1 is a perspective view of a diode laser pump module with a staircase manifold structure and a plurality of thermo-optical ground planes according to at least one aspect of the present disclosure.

In one aspect, the present disclosure provides a thermal management system and optical bench for a diode laser device referred to herein as a thermo-optical ground plane. In various aspects, the present disclosure also provides a diode laser pump module comprising a plurality of thermo-optical ground planes each comprising a diode laser device mounted thereon, where the diode laser pump module is configured to amplify optical power in a fiber laser using for example six diode pump modules to pump a single active gain fiber. In one aspect, the diode laser pump module has a staircase configuration and in another aspect, the diode laser pump module has a substantially planar configuration.

In one aspect, the thermo-optical ground plane according to the present disclosure is configured to spread the heat from the diode laser device and to cool the optical bench in a relatively small size and low weight. Accordingly, the diode laser pump module can be implemented in a light-weight small size form factor. The configuration of the thermo-optical ground plane according to the present disclosure, enables efficient cooling in a lightweight and small package and at a relatively low coolant flowrate.

In one aspect, the thermo-optical ground plane according to the present disclosure comprises a diode laser plate configured to mount a diode laser device, to spread the heat and to cool the diode laser device, and hold beam shaping and folding optics including, without limitation, fast axis collimator, slow axis collimator, turning prism, or turning mirror, or any combination thereof. In one aspect, multiple diode laser plates with diode laser devices mounted thereon may be stacked vertically or horizontally to combine the optical power from the multiple diode laser devices and to couple the combined optical power into a single core optical power delivery fiber. In one aspect, the single core optical power delivery fiber may have a diameter from 10 μm to 225 μm.

In one aspect, the diode laser plate according to the present disclosure is configured to remove heat generated by the diode laser device using a coolant flowrate that is more than five times lower than coolant flowrates employed by a conventional thermal management system and employs a coolant pumping power that is more than 100 times lower than a conventional thermal management system.

In one aspect, the apparatus according to the present disclosure provides a dual purpose optical bench. In one aspect, the dual purpose optical bench functions as a heat spreader and as a structural component for attaching optical elements thereto. The optical elements comprise a diode laser device, fast axis collimator, slow axis collimator, turning prism, or turning mirror, or any combination thereof.

In one aspect, the optical elements may be mounted on a plate having a high thermal conductivity and structural integrity to spread heat generated by the diode laser device and to hold the beam shaping optics such as the fast axis collimator, slow axis collimator, turning prism, or turning mirror.

The dual purpose optical bench also comprises a high thermal conductivity heat spreader with a low-profile low-flowrate cooler. The low-profile low-flowrate cooler defines a large channel to remove heat at a very low flowrate. High thermal conductivity of the heat spreader is achieved through evaporation of a working fluid contained in an evaporation chamber underneath the diode laser device and the condensation of the vapor above the low-profile low-flowrate cooler. Working fluid may be pumped from a condenser to the evaporator through capillary action. In one aspect, the evaporation chamber comprises a porous medium that is saturated with the working fluid.

In one aspect, the thermo-optical ground plane defines an evaporation chamber that functions as an evaporation chamber comprising a porous medium saturated with a working fluid. During operation, heat from the diode laser device vaporizes the working fluid in the evaporation chamber underneath the diode laser device. The vapor spreads the heat over a surface area defined by the evaporation chamber that is substantially greater than the surface area of the laser diode device. Vapor spreading reduces the heat flux into the cooling channels enabling cooling of the laser diode device at a flowrate per diode laser device or diode laser pump module that is at least five times lower than for conventional cooling techniques. As a result, the size and weight of diode pump modules, cooling liquid pump, and coolant reservoir is significantly reduced providing significant system level weight and volume savings.

In one general aspect, the thermo-optical ground plane is formed from a compact high thermal conductivity heat spreader. The heat spreader defines an evaporation chamber comprising a porous medium disposed therein, where the porous medium is saturated with a working fluid to spread the heat by vaporizing the working fluid and dissipating the heat generated by the diode laser device over the entire surface area defined by the heat spreader. Multiple structural supporting elements are located in the evaporation chamber to rigidize the heat spreader. Large cooling channels circulate coolant at low flowrates and low pressure drop are located underneath the heat spreader to condense the vaporized working fluid in the evaporation chamber above the cooling channels.

In one aspect, the thermo-optical ground plane also functions as an optical bench and is configured to attach optical elements such as, for example, fast axis collimator, slow axis collimator, turning prism, and/or turning mirror thereto. The fast axis collimator collimates the vertical fast axis diverging laser beam. The slow axis collimator collimates the horizontal slow axis diverging laser beam. The turning prism or turning mirror is attached to the optical bench to turn the laser beam 90 degrees from the diode laser device output facet. The optical elements may be attached to the thermo-optical ground plane with epoxy or solder such as, for example, UV curable epoxy or indium solder.

In one aspect, the present disclosure provides a diode laser pump module comprising a plurality of thermo-optical ground planes that are power combined and fiber coupled into a single power delivery fiber and used to pump a fiber laser of a high energy laser system. The diode laser pump module operates at a significantly reduced coolant flowrate, which reduces the size of the coolant pump and fluid reservoir. Thus, the diode laser pump module according to the present disclosure enables low size and weight high energy laser systems compared to conventional systems having a comparable optical power output.

In one aspect, the diode laser pump module comprises multiple adjacent thermo-optical ground planes for mounting diode laser devices thereon. The multiple adjacent thermo-optical ground planes and diode laser devices can be arranged either in a staircase configuration or in a substantially planar configuration to combine output light from the multiple diode laser devices. The diode laser pump module comprises a liquid manifold structure to supply and return coolant to the individual thermo-optical ground planes to condense the vaporized working fluid in the evaporation chambers below each diode laser device.

In one aspect, optical elements may be provided at one end of the staircase or planar liquid manifold structure of the diode laser pump module to focus light generated by the multiple diode laser devices into a single core optical power delivery fiber. The focusing optical elements include a focuser barrel, a relay barrel, and a connector mode stripper.

In one aspect, the compact optical bench with dual functionality according to the present disclosure provides rigidity, stiffness, surface finish, and flatness suitable for mounting multiple diode laser devices and optical elements thereon, spreading heat over a large surface area, and removing the heat by circulating a coolant at a low-flowrate. The optical bench comprises ribs or pillars to stiffen the hollow areas within the structure that define the evaporation chambers. The evaporation chambers comprise a porous medium saturated with a working fluid to spread heat by way of vapor formation and vapor flow over the surface defined by the evaporation chamber. In one aspect, the compact optical bench also comprises alignment elements and features such as mechanical stops, corners, slider edges, and pockets as part of an otherwise flat surface to provide primarily passive optics alignment and to minimize active optics alignment. The optical elements may be bonded to the optical bench using indium solder or UV curable epoxy.

In one aspect, the coolant channel defines a relatively large aperture having a width that is the range of 0.5 mm to 2.00 mm. In a preferred aspect, the width is in the range of 0.7 mm to 1.00 mm. The relatively large aperture of the coolant channel prevents clogging of industrial coolant circulating in the coolant channel over long term operation. In one aspect, the industrial coolant may be propylene-glycol-water.

In one aspect, the optical power delivery fiber has a core size that is less than 225 micrometers with a numerical aperture (NA) less than 0.22. Multiple optical bench elements may be configured to form a diode laser pump module for amplification of light of a fiber laser. The diode laser pump module has specific volume of less than 0.7 cc/W and specific weight less than 0.7 g/W. The diode laser pump module can operate at coolant flowrates less than 0.5 GPM of water or propylene-glycol-water while providing optical output power greater than 500 W. The diode laser pump module includes a liquid flow manifold that uniformly distributes coolant to multiple optical bench elements.

Figure 2:
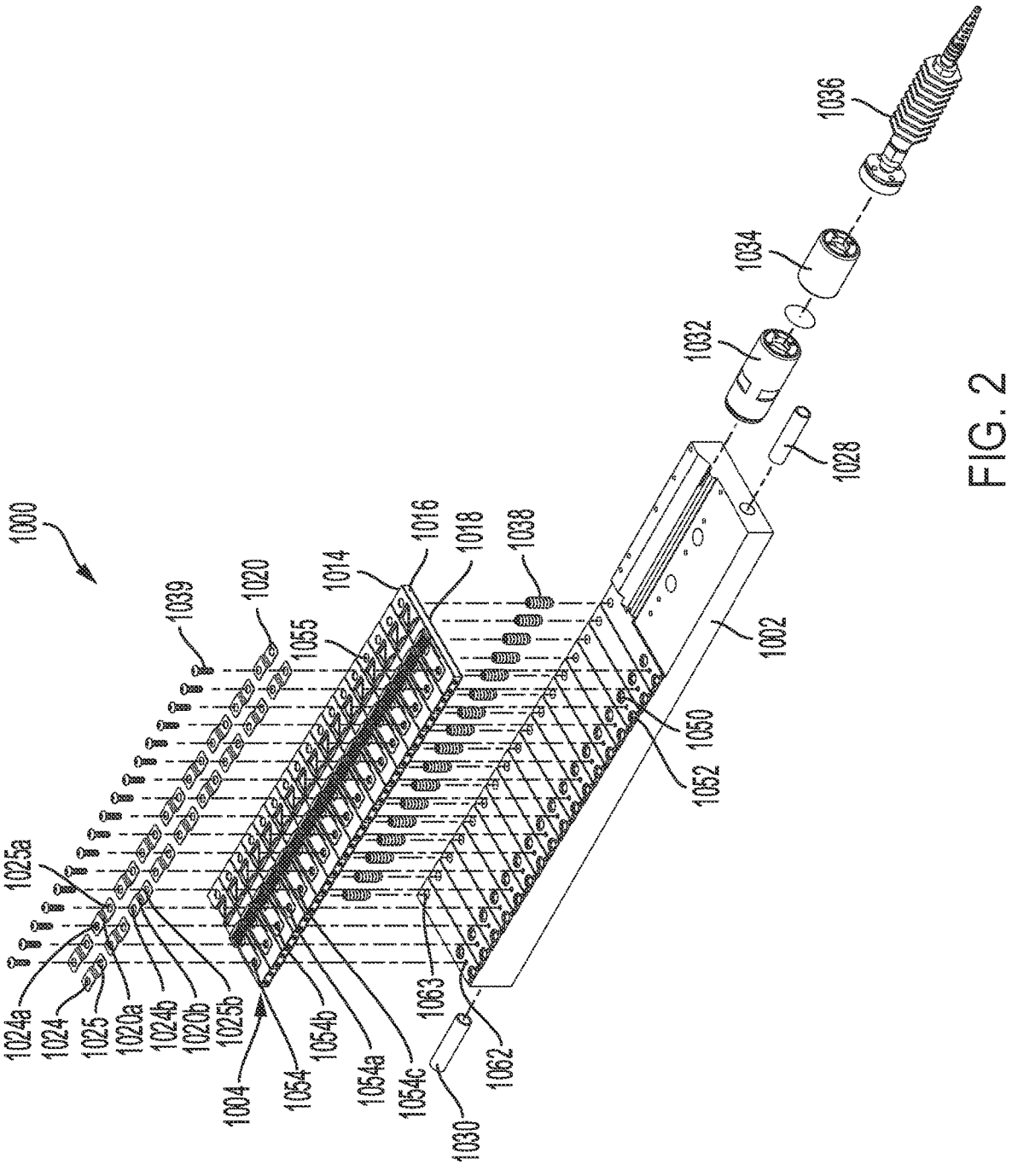
FIG. 2 is an exploded view of the diode laser pump module shown in FIG. 1 according to at least one aspect of the present disclosure.

Turning now to the figures, FIG. 1 is a perspective view of a diode laser pump module 1000 with a staircase manifold structure. FIG. 2 is an exploded view of the diode laser pump module 1000 shown in FIG. 1. In the staircase manifold structure shown in FIG. 1, a plurality of thermo-optical ground planes (TOGPs) 1004 are attached to the top surface of the staircase manifold 1002. Also attached to the top surface of the staircase manifold 1002 are a focuser lens barrel 1032, a relay barrel 1034, and a connector mode stripper 1036. The staircase manifold structure enables the optical power from the plurality of TOGPs 1004 to be combined and to achieve fiber coupling into a single optical power delivery fiber.

Within the staircase manifold 1002 is a manifold inlet tube 1028 and a manifold outlet tube 1030. The manifold inlet tube 1028 extends into a flow passage through the staircase manifold 1002 underneath each TOGP 1004. The manifold inlet tube 1028 receives a coolant to distribute to each TOGP 1004. The manifold outlet tube 1030 extends through the staircase manifold 1002 underneath each TOGP 1004. The manifold outlet tube 1030 releases the coolant after it has been distributed throughout the staircase manifold 1002.

The staircase manifold defines a plurality of first manifold mounting holes and a plurality of second manifold mounting holes. The staircase manifold defines a first manifold mounting hole 1062 and a second manifold mounting hole 1063 to connect a TOGP 1004 to the staircase manifold 1002. The staircase manifold 1002 defines a plurality of first manifold mounting holes 1062 and second manifold mounting holes 1063 corresponding to the number of TOGPs 1004.

The TOGP 1004 defines a first TOGP mounting hole 1054 and a second TOGP mounting hole 1055. The first TOGP mounting hole 1054 corresponds to the first manifold mounting hole 1062. The second TOGP mounting hole 1055 corresponds to the second manifold mounting hole 1063.

The first manifold mounting hole 1062 and the first TOGP mounting hole 1054 receive a first screw 1038. The second manifold mounting hole 1063 and the second TOGP mounting hole 1055 receive a second screw 1039. A plurality of first and second screws 1038, 1039 attach the plurality of TOGPs 1004 to the staircase manifold 1002. Other fasteners for attaching the plurality of TOGPs 1004 to the staircase manifold 1002 may be employed.

A first TOGP 1004a is connected to a second TOGP 1004b by a diode plate electrical interconnect 1020. The first diode plate electrical interconnect 1020a defines a first hole 1024a and a second hole 1025a. The first hole 1024a of the diode plate electrical interconnect 1020a is placed over the first TOGP mounting hole 1054b of the second TOGP 1004b. The second mounting hole 1025a of the diode plate electrical interconnect 1025a is placed over the first TOGP mounting hole 1054a of the first TOGP 1004a.

A second diode plate electrical interconnect 1020b defines a first hole 1024b and a second hole 1024b. The second diode plate electrical interconnect 1020b connects the first TOGP 1004a to a third TOGP 1004c. The first hole 1024b of the diode plate electrical interconnect 1020b is placed over the first TOGP mounting hole 1024b of the first TOGP 1054a. The second hole 1024b of the diode plate electrical interconnect 1025b is placed over the first TOGP mounting hole of the third TOGP 1062c. The plurality of screws 1039 connect the first diode plate interconnect 1020a, the second diode plate interconnect 1020b, the first TOGP 1004a, and the staircase manifold 1002. The plurality of screws 1039 extend through the first diode plate electrical interconnect 1020a, the second diode plate electrical interconnect 1020b, the TOGP 1004, and into the staircase manifold 1002.

With reference now to FIGS. 3-10, FIG. 3 is a detailed view of the TOGP 1004 that illustrates the flow of photons emitted by the diode laser device array. The TOGP 1004 comprises a first plate 1014, a body 1016, and a second plate 1018. The body 1016 is located between the first and second plates 1014, 1018. At a first end of the TOGP 1004, a first mounting hole 1054 is disposed, nearest to sub-mount plate 1068. The sub-mount plate is configured to receive a diode laser device 1066 mounted thereon. At least one electrical conductor 1064 is disposed on the top surface of the diode laser device to establish electrical connection to diode laser device 1066. In various aspects, the electrical conductor 1064 may be one or more wire bonds, one or more ribbons, or conducting copper foil. At a second end of the TOGP 1004, a second mounting hole 1055 is disposed, nearest to a turning prism 1006. The first mounting hole 1054 and the second mounting hole 1055 extend through the first plate 1014, the body 1016, and the second plate 1018. The sub-mount plate 1068 provides electrical insulation of the diode laser device from the TOGP 1004 and consists of any high thermal conductivity metalized ceramics such as aluminum nitride or beryllium oxide. Metallization on the ceramics is copper followed by nickel and gold.

The first plate 1014 is configured to mount beam shaping optics. The beam shaping optics can be, but are not limited to, a fast axis collimator (FAC) 1010, a slow axis collimator (SAC) 1008, and a turning prism 1006. In another aspect, the turning prism 1006 can be a turning mirror. The first plate 1014 also comprises a sub-mount plate 1068 for mounting a diode laser device 1066 thereon. It will be appreciated by those skilled in the art that diode laser device 1066 may be referred to as a mini-bar diode laser comprising multiple diode laser emitters. In one aspect of the present disclosure, the diode laser device 1066 may comprise five diode laser emitters. The diode laser device 1066 may be attached to the first plate 1014 or the sub-mount plate 1068 using solder or other suitable low thermal resistance attachment methods. The diode laser device 1066 is in thermal communication with the sub-mount plate 1068. The sub-mount plate 1068 is in thermal communication with the first plate 1014.

The FAC 1010 collimates the vertical fast diverging laser beam. The SAC 1008 collimates the horizontal slow diverging laser beam. The optical elements are attached to the first plate 1014 using epoxy such as UV curable epoxy or solder such as indium solder, or other suitable attachment methods.

Figure 3:
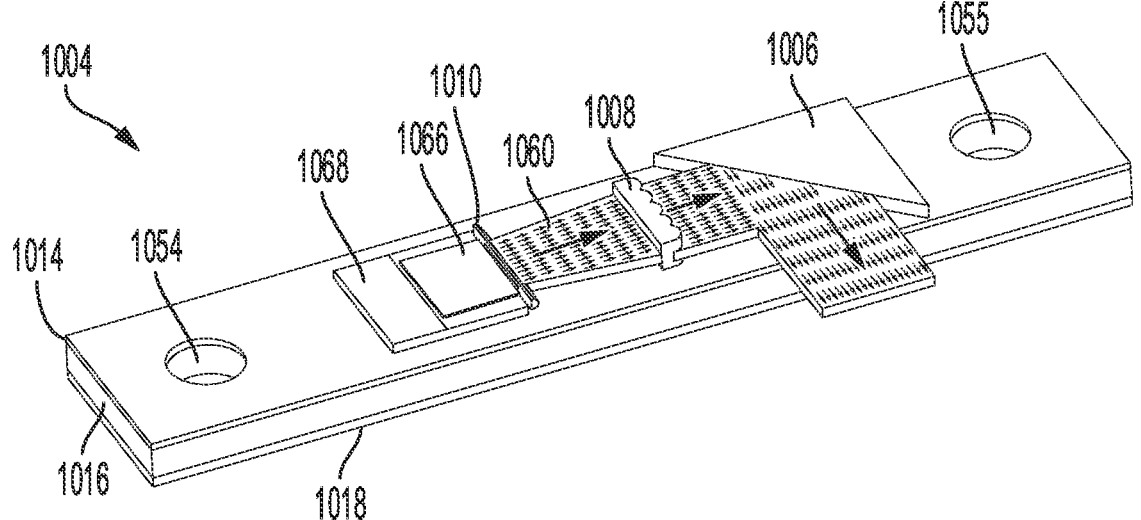
FIG. 3 is a perspective view of a thermo-optical ground plane with a depiction of the light path from a diode laser device according to at least one aspect of the present disclosure.

As shown in FIG. 3, the path along which the photons 1060 travel from the diode laser device 1066 is shown by the arrows. The photons 1060 emitted by the diode laser device 1066 travel from an output facet through the FAC 1010. From the FAC 1010 the photons 1060 travel along the longitudinal axis of the TOGP 1004 to the SAC 1008. From the SAC 1008, the photons 1060 travel to the turning prism 1006 and are redirected at a right angle or 90 degrees to the longitudinal axis of the TOGP 1004. Accordingly, the photons 1060, which originally traveled along the longitudinal axis of the TOGP 1004, travel in a direction perpendicular to the TOGP 1004 after being redirected by the turning prism 1006. After the photons 1060 are redirected perpendicular to the TOGP 1004, the photons 1060 travel along the length of the diode laser pump module 1000 (FIG. 1) to beam shaping optics. It will be appreciated that the photons may be redirected at any predetermined angle relative to the longitudinal axis.

Figure 4:
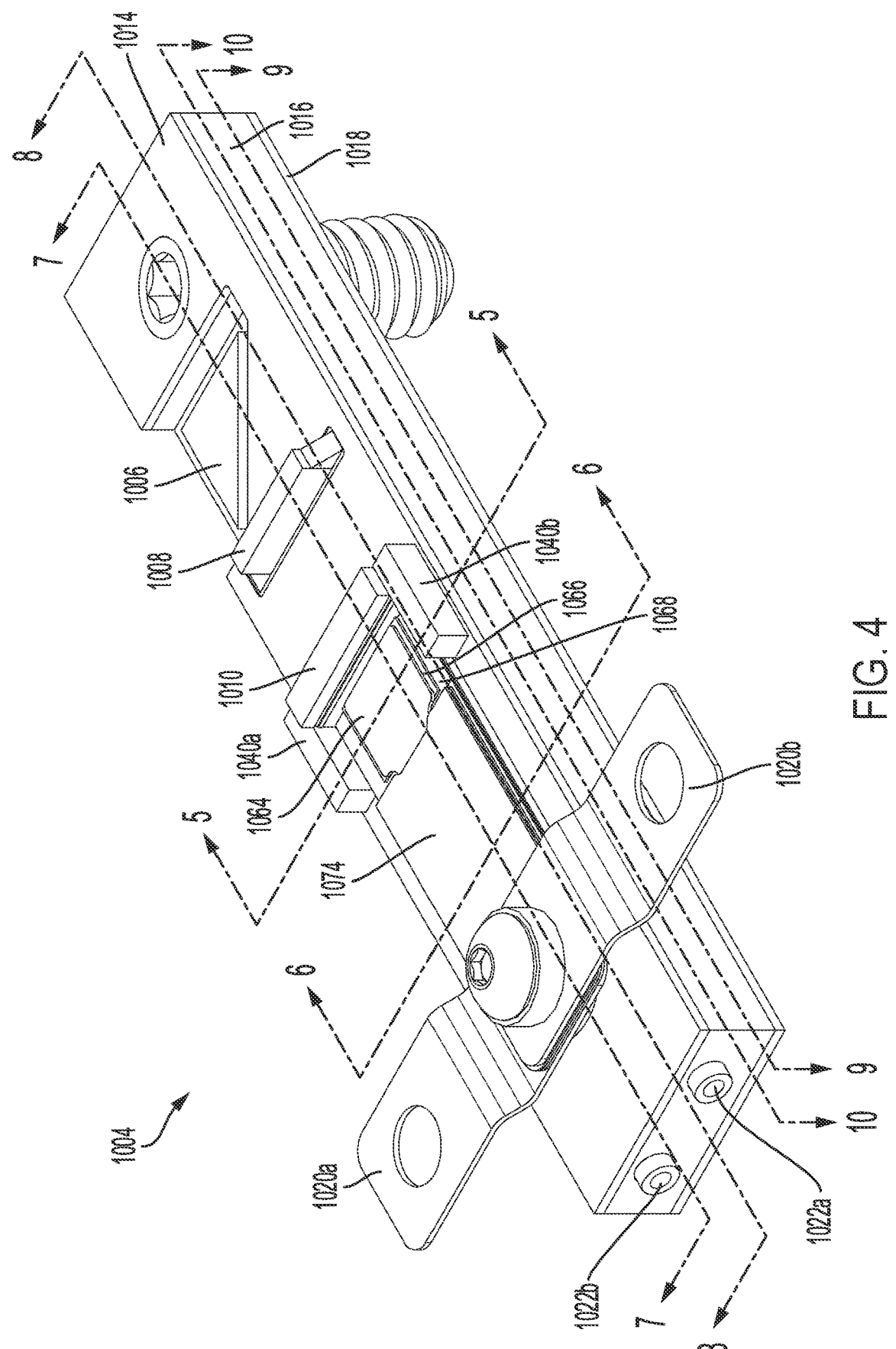
FIG. 4 is a detailed perspective view of the thermo-optical ground plane according to at least one aspect of the present disclosure.

With reference to FIG. 4, at a first end of the TOGP 1004, a first tube 1022*a* and a second tube 1022*b* extend outwardly from the body 1016. (Further shown in FIG. 8). Working fluid may be charged through the first and second tubes 1022*a*, 1022*b* as described below.

Still with reference to FIG. 4, disposed on the top surface of the first plate 1014, the FAC 1010 is held in place by FAC retainers 1040*a*, 1040*b*. The FAC retainers 1040*a*, 1040*b* are positioned on opposite sides of the FAC 1010. In one aspect, the FAC retainers 1040*a*, 1040*b* extend past the FAC 1010 to the sides of the diode laser sub-mount plate 1068.

Figures 5, 6:
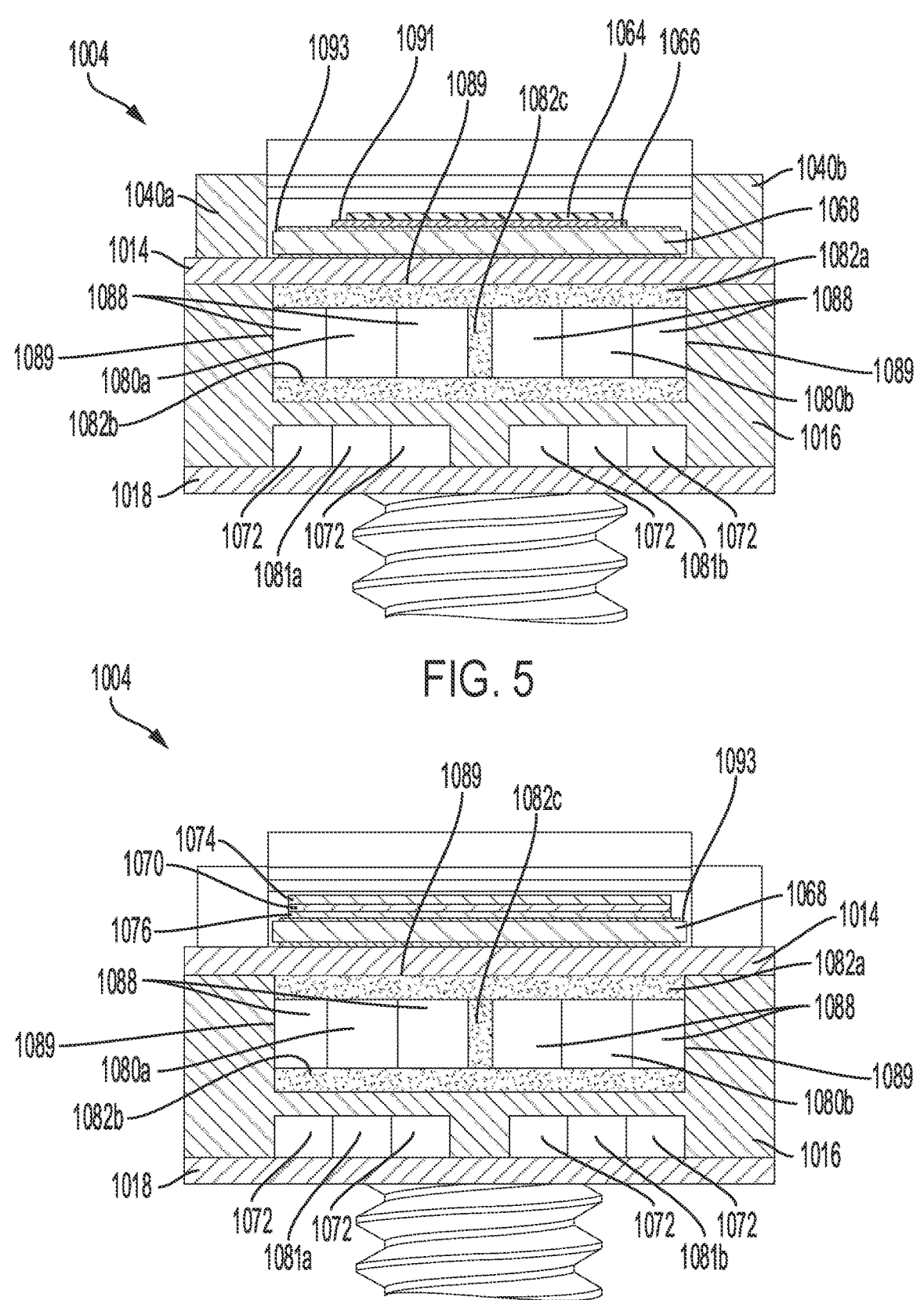
FIG. 5 is a cross-sectional view of the thermo-optical ground plane shown in FIG. 4 taken along section 5-5 through the diode laser device.
FIG. 6 is a cross-sectional view of the thermo-optical ground plane shown in FIG. 4 taken along section 6-6 through an interconnect lead top.

With reference now to FIGS. 5-6, disposed on the first plate 1014 is a diode laser sub-mount plate 1068 that is in thermal communication with the first plate 1014. The diode laser device 1066 is mounted to and is in thermal communication with the diode laser sub-mount plate 1068. Disposed on a top surface of the diode laser sub-mount plate 1068 is an interconnect lead 1076. The interconnect lead 1076 connects to the screw 1039. Disposed on the top surface of the interconnect lead 1076 is a lead insulator 1070. Disposed on a top surface of the lead insulator 1070 is the interconnect lead top 1074. The interconnect lead 1074 is in electrical communication with the bottom of the diode laser device 1066 established through the diode laser sub-mount plate 1068. The interconnect lead top 1074 is in electrical communication with the top of the diode laser device 1066 established through the electrical conductor 1064.

With reference to FIGS. 3-10, the TOGP 1004 comprises an evaporation chamber 1088. The evaporation chamber 1088 is defined between the body 1016 and the first plate 1014. The evaporation chamber 1088 is configured to receive a working fluid through the first and second tubes 1022*a*, 1022*b*. For example vacuum is applied to the first tube 1022*a* and working fluid such as degassed water is precisely metered through the second tube 1022*b*. After sufficient amount of working fluid is introduced into the evaporation chamber 1088, both tubes 1022*a* and 1022*b* are permanently terminated using for example a pinch-off tool. The evaporation chamber 1088 comprises porous medium 1082*a*, 1082*b*, 1082*c* to hold the working fluid and to transport the working fluid by capillary action from the condenser porous medium 1082*b* to evaporator porous medium 1082*a* via one or more porous medium posts 1082*c*. The evaporation chamber 1088 is in thermal communication with the diode laser sub-mount plate 1068 and the diode laser device 1066. Heat generated by the diode laser device 1066 vaporizes the working fluid in the evaporator porous medium 1082*a* and transfers the vapor to the condenser porous medium 1082*b* where it condenses and rejects the heat to cooling channel 1072. The surface area of the condenser porous medium 1082*b* is at least ten-times greater than the surface area 1091 of the diode laser device 1066 or the surface area 1093 of the diode laser sub-mount plate

1068 making the evaporation chamber a very effective heat flux transformer which greatly reduces the heat flux of the diode laser device 1066 into much lower heat flux that enters cooling channel 1072 enabling drastic reduction in flowrate requirement through channel 1072. The heat generated by the diode laser device 1066 is evenly dissipated over nearly the entire surface area of the second plate 1018 and the surface area defined by the evaporation chamber 1088.

A plurality of structural support members 1080*a*, 1080*b* are disposed within the evaporation chamber 1088. The structural support members 1080*a*, 1080*b* provide rigidity to the TOGP 1004. In one aspect, the structural support members 1080*a*, 1080*b* are made of the same material as the body 1016.

A cooling channel 1072 is defined between the body 1016 and the second plate 1018. The channel 1072 is configured to receive and circulate a coolant at a predetermined flowrate. The channel 1072 is positioned adjacent to and in thermal communication with the evaporation chamber 1088 to transfer heat from the evaporation chamber 1088 to the coolant circulating in the channel 1072. A plurality of heat transfer fins or pins 1081*a*, 1081*b* are disposed within the channel 1072 to increase the heat transfer surface area for transferring the heat to coolant and also to provide rigidity to the TOGP 1004.

High thermal conductivity is achieved through evaporation of the working fluid contained in the evaporation chamber 1088 underneath the first plate 1014 and the condensation of the vapor above the channel 1072 of the low-profile low-flowrate cooler. The working fluid is returned from the condenser porous medium 1082*b* to evaporator porous medium 1082*a* through capillary action. The working fluid is saturated in the porous medium 1082*a* and 1082*b*.

During operation, heat from the diode laser device 1066 vaporizes the working fluid contained in evaporator porous medium 1082*a* underneath the diode laser device 1066. The vapor spreads the heat over the surface area defined by the inner walls 1089 of the evaporation chamber 1088 that is substantially greater than the surface area 1091 of the diode laser device 1066 and is substantially greater that the surface 1093 of the diode laser sub-mount plate 1068. Vapor spreading inside evaporation chamber 1088 reduces heat flux from the diode laser device 1066 for more than at least ten times reducing the coolant flowrate requirement in channel 1072 for more than five times compared to the conventional cooling techniques that rely on heat removal with coolant directly under the diode laser device 1066. As a result, the size and weight of coolant pump and coolant reservoir for a diode pump module based on TOGP 1004 can be significantly reduced to provide significant weight and volume savings for a system level thermal management system.

The channel 1072 defines a large cross sectional area to facilitate the flow of coolant through the TOGP 1004 with minimum particulate filtration requirement. The channel 1072 facilitates the flow of the coolant through the TOGP 1004 in order for the working fluid contained in evaporation chamber 1088 to condense and to transfer the heat to the coolant flowing through the channel 1072. As the coolant flows through the channel 1072 at a low flowrate, it removes the heat as it flows through the TOGP 1004 and into staircase manifold 1002. In one aspect, the channel 1072 defines a width selected from a range from 0.5 mm to 2.0 mm and preferably greater than 0.7 mm to enable clog free operation of the circulating coolant. This large channel size compared to conventional sub 0.3 mm or even sub 0.05 mm is beneficial as it minimizes total cooling loop pressure drop and minimizes maintenance requirements associated with replacement of filter cartridges. In one aspect, the coolant is propylene-glycol-water or water, or any suitable coolant. In one aspect, the coolant flowrate in the channel 1072 for entire diode pump module based on multiple TOGP 1004 with total optical output power greater than 500 Watts may be selected from a range of 0.1 gallons per minute (GPM) to 1.0 GPM or preferably less than 0.5 GPM.

Figures 7, 8:
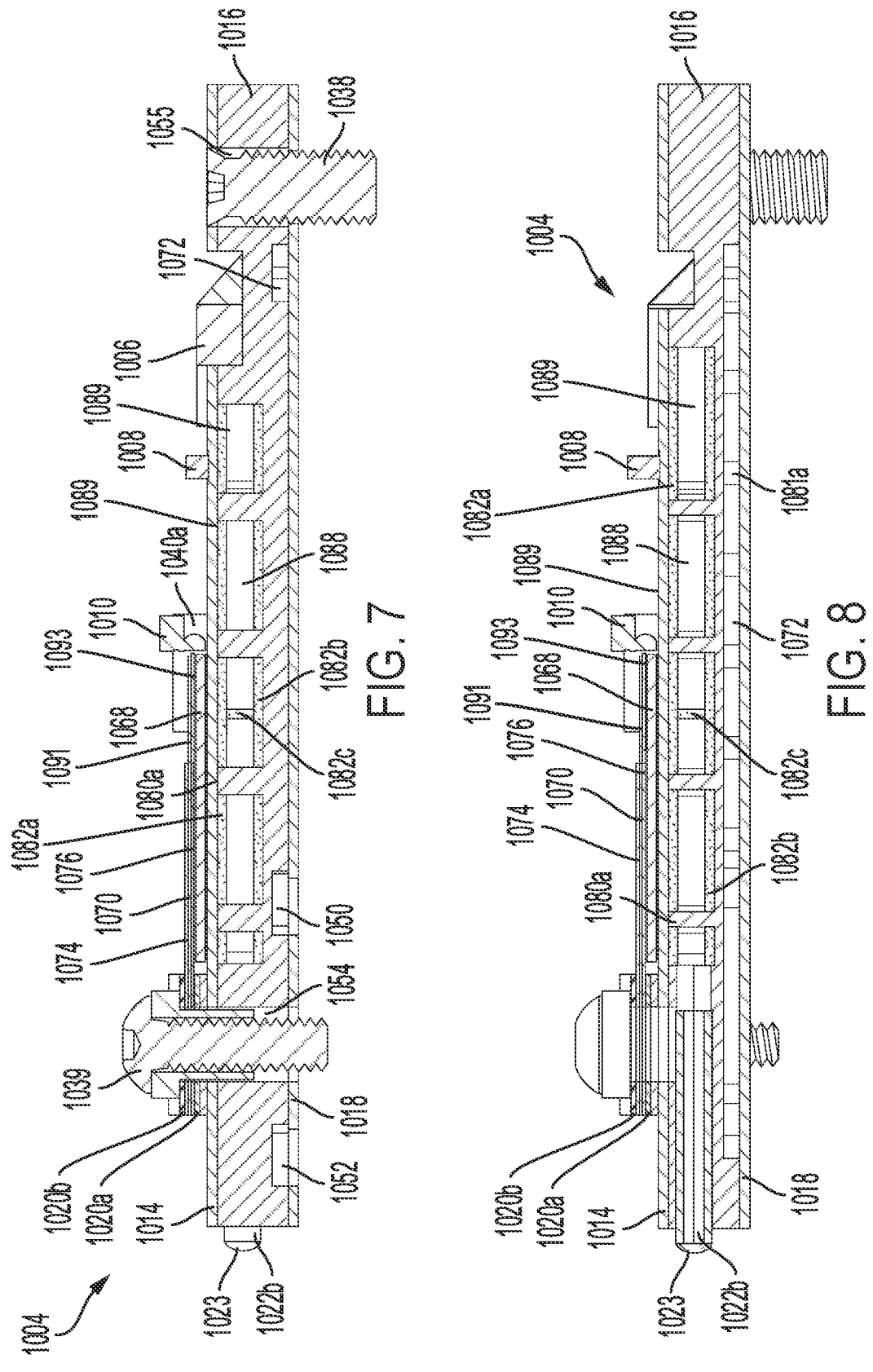
FIG. 7 is a cross-sectional view of the thermo-optical ground plane shown in FIG. 4 taken along section 7-7.
FIG. 8 is a cross-sectional view of the thermo-optical ground plane shown in FIG. 4 taken along section 8-8 through a first tube.

FIG. 7 is a cross-sectional view of the TOGP 1004 shown in FIG. 4 taken along section 7-7. With reference also to FIGS. 1-10 and 21-23, within the TOGP 1004 is defined an inlet channel 1050 to the channel 1072 and an outlet channel 1052 from the channel 1072. The inlet channel 1050 carries the coolant from a staircase manifold inlet channel 1056 (see FIGS. 21-23) into the channel 1072. The outlet channel 1052 carries the coolant from the channel 1072 to a staircase manifold outlet channel 1058 (see FIGS. 18-20).

Figure 21:
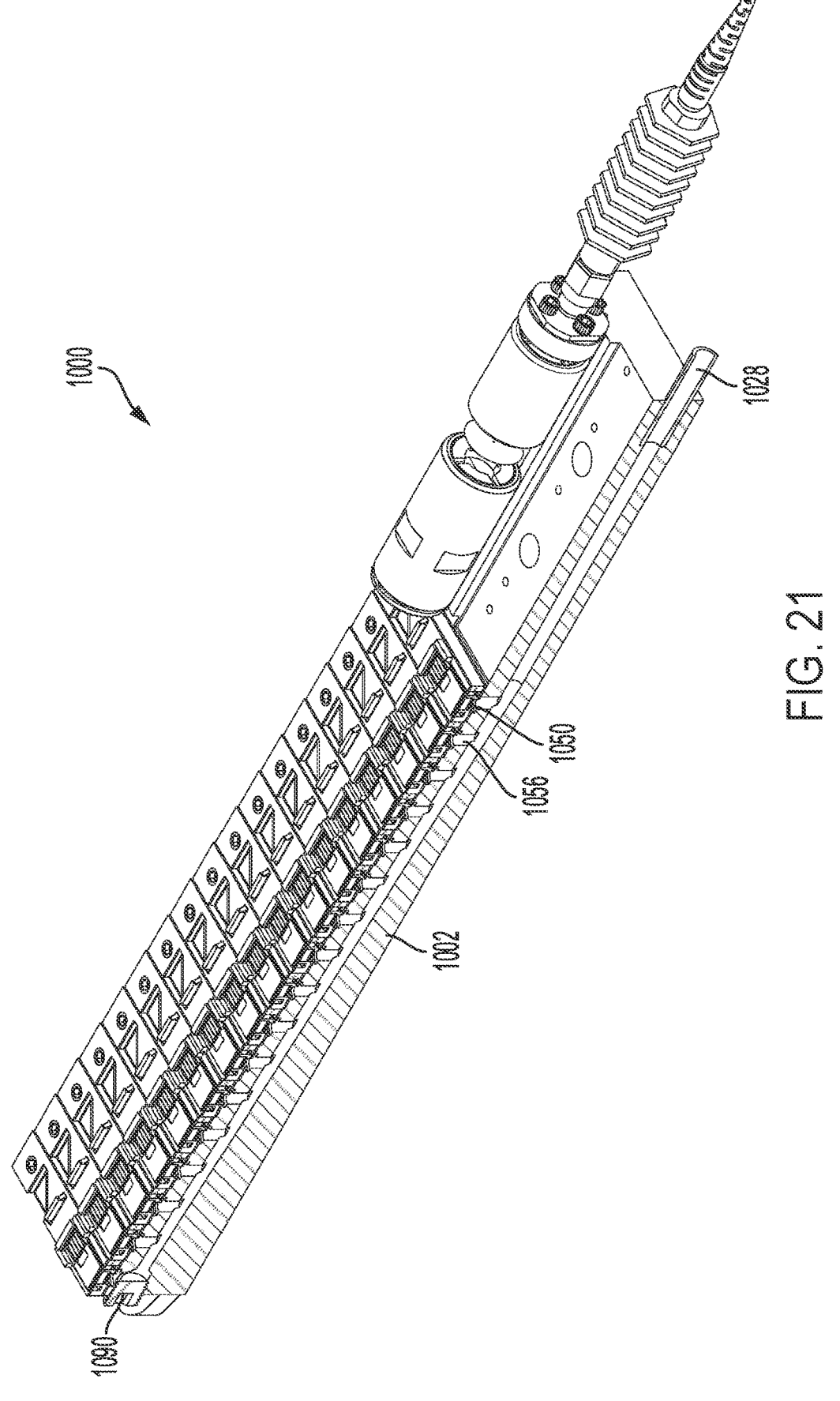
FIG. 21 is a cross-sectional perspective view of the diode laser pump module shown in FIG. 1 taken through a manifold inlet tube.
Figures 22, 23:
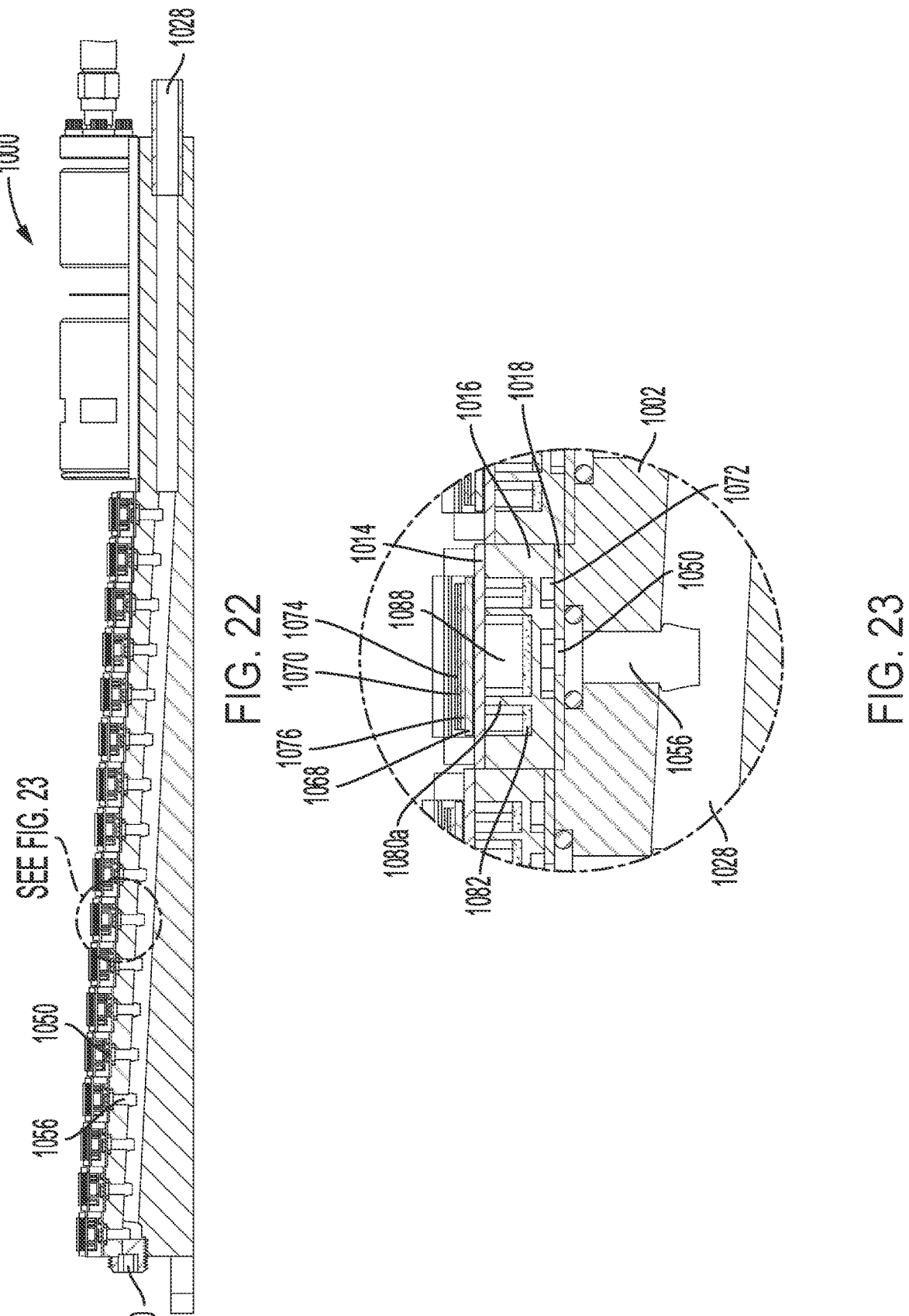
FIG. 22 is a side cross-sectional view of the diode laser pump module shown in FIG. 21.
FIG. 23 is a magnified view of a portion of the diode laser pump module shown in FIG. 22.

Still with reference to FIGS. 1-10 and 21-23, the inlet channel 1050 extends through the second plate 1018 into the body 1016, where the inlet channel 1050 meets the channel 1072 (see FIGS. 22-23). The outlet channel 1052 extends through the second plate 1018 into the body 1016, where the outlet channel 1052 meets the channel 1072. The inlet channel 1050 is in fluid communication with the staircase manifold inlet channel 1056 (see FIGS. 18-23). The outlet channel 1052 is in fluid communication with the staircase manifold outlet channel 1058 (see FIGS. 21-23). The fluid coupling between the inlet channel 1050 and the staircase manifold inlet channel 1056 facilitates the connection between the TOGP 1004 and the staircase manifold for the coolant to flow into the TOGP 1004. The fluid coupling between the outlet channel 1052 and the staircase manifold outlet channel 1058 facilitates the connection between the TOGP 1004 and the staircase manifold for the coolant to flow out of the TOGP 1004. As shown in FIG. 7-8, the first and second tubes 1022a and 1022b include terminated ends 1023 at the end of the first and second tube 1022a,1022b that extends out of the body 1016 of the TOGP 1004. The terminated ends 1023 are achieved through a cold pinch-off or crimping and welding of the end of the first and second tube 1022a, 1022b that extends out of the body 1016 of the TOGP 1004. The terminated ends 1023 ensure a good seal and air free evaporation/condensation inside evaporation chamber 1088.

Figures 9, 10:
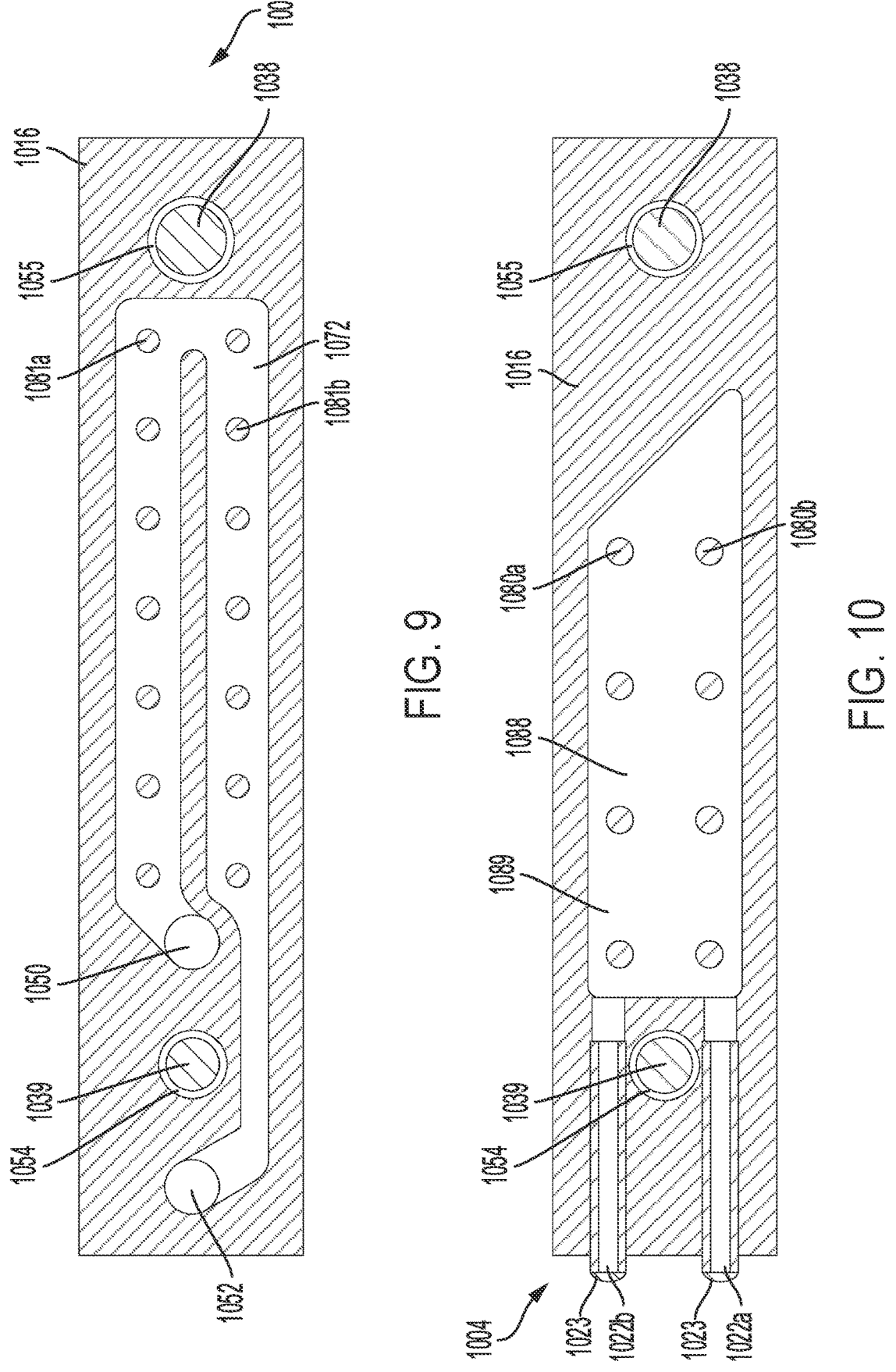
FIG. 9 is a cross-sectional view of the thermo-optical ground plane shown in FIG. 4 taken along section 9-9 through a channel defined in the thermo-optical ground plane.
FIG. 10 is a cross-sectional view of the thermo-optical ground plane shown in FIG. 4 taken along section 10-10 through an evaporation chamber defined by the thermo-optical ground plane.

FIG. 9 is a cross-sectional view of the TOGP 1004 shown in FIG. 4 taken along section 9-9 through the channel 1072 defined in TOGP 1004. As shown in FIG. 9, the TOGP cooling channel 1072 extends through the body 1016. The channel 1072 includes a plurality of heat conducting pins 1081a and 1081b that also serve as structural support elements to add rigidity to the TOGP 1004. The inlet channel 1050 fluidically couples to the channel 1072. The outlet channel 1052 fluidically couples to the channel 1072. The coolant flows through the inlet channel 1050 into the channel 1072. The coolant flows through channel 1072 to the outlet channel 1052 and then out through outlet channel 1052. As the coolant flows through the channel 1072, vapor in the evaporation chamber 1088 condenses and rejects the heat from the evaporation chamber 1088 to the coolant in the channel 1072. In this manner, the vapor in the evaporation chamber 1088 dissipates heat evenly to the channel 1072 as it is removed by the low flowrate circulating coolant.

FIG. 10 is a cross-sectional view of the thermo-optical ground plane shown in FIG. 4 taken along section 10-10 through the evaporation chamber 1088 defined by the TOGP 1004. As shown in FIG. 10, the evaporation chamber 1088 is a cavity that contains a plurality of structural support elements 1080a, 1080b to add rigidity to the TOGP 1004. The tubes 1022a, 1022b are fluidically coupled to the evaporation chamber 1088 to deliver working fluid to the evaporation chamber 1088 and are subsequently terminated through termination 1023. In one aspect, the working fluid can be degassed water. While the coolant flows through the channel 1072, below the evaporation chamber 1088, the evaporation chamber 1088 spreads the heat with vapor formation and vapor flow. High thermal conductivity is achieved through evaporation of the working fluid underneath the first plate 1014 that supports the diode laser plate sub-mount 1068 and the diode laser device 1066. The vapor in the evaporation chamber 1088 generated by the heat of the diode laser device 1066 is condensed by the flowing coolant in the low-profile cooler channel 1072 below the evaporation chamber 1088. The working fluid may be pumped from a condenser porous medium 1082b to evaporator porous medium 1082a in the evaporator chamber 1088 through capillary action (see FIGS. 5-8). One or more porous medium posts 1082c may be used to facilitate capillary return of liquid from condenser porous medium 1082b to evaporator porous medium 1082a. As shown in FIGS. 9 and 10, mounting holes 1054, 1055 receive screws 1038, 1039 respectively to fasten the TOGP 1004 to the staircase manifold 1002.

Figures 11, 12:
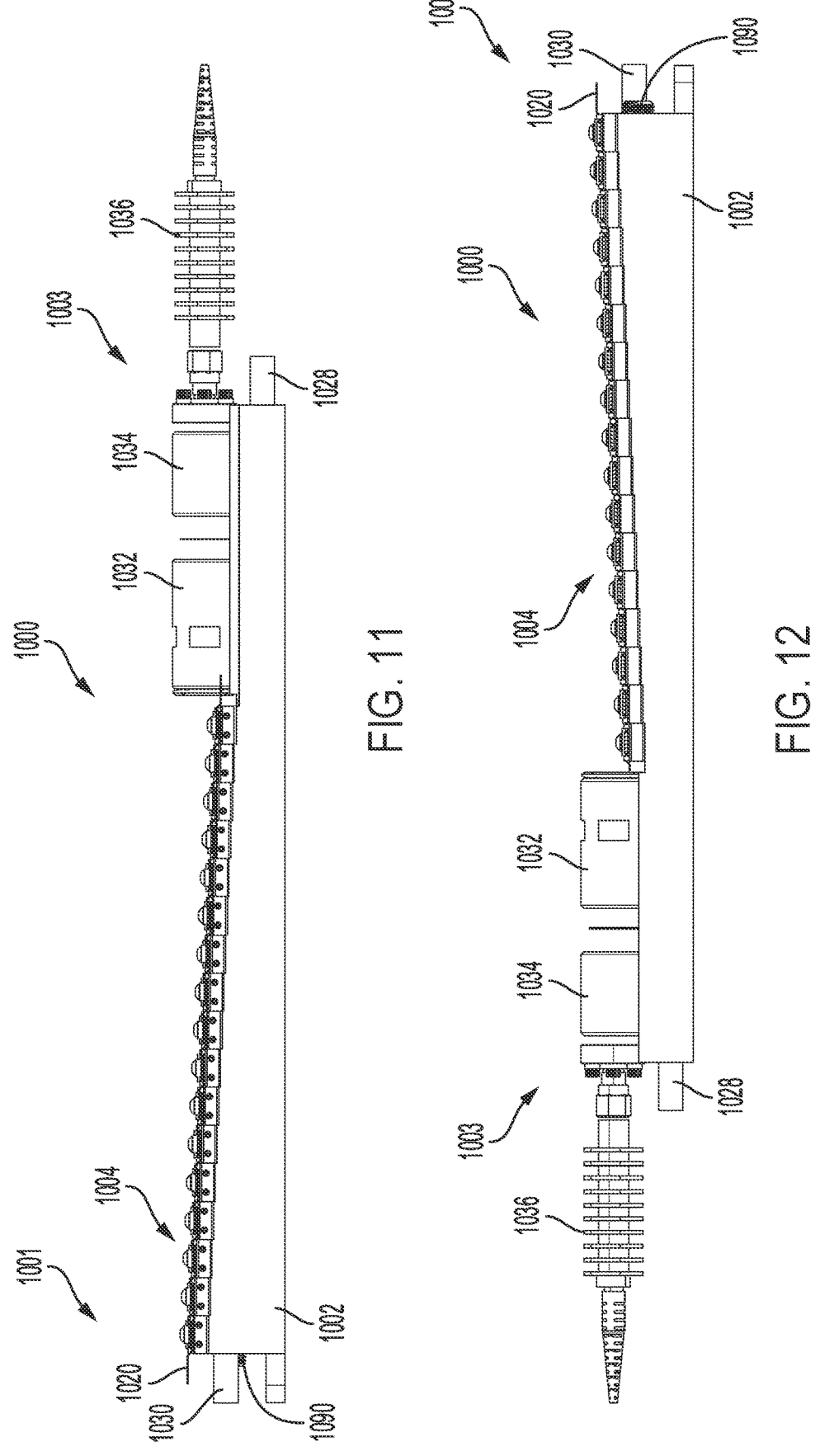
FIG. 11 is a first side view of the diode laser pump module shown in FIG. 1.
FIG. 12 is a second side view of the diode laser pump module shown in FIG. 1.
Figure 13:
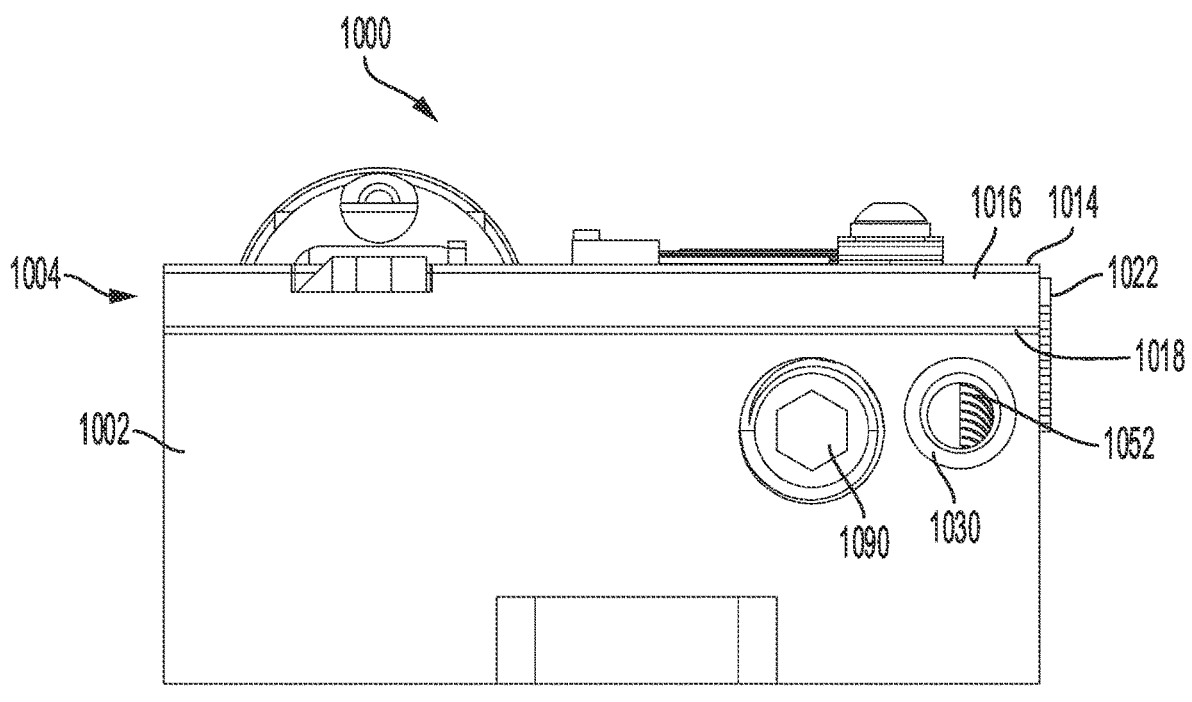
FIG. 13 is a first end view of the diode laser pump module shown in FIG. 1.
Figure 14:
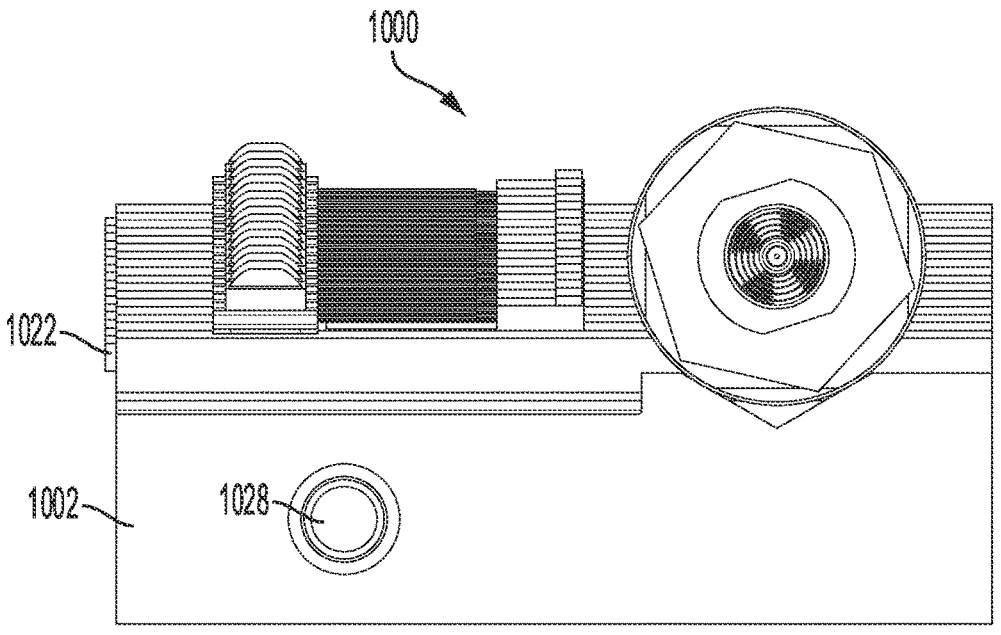
FIG. 14 is a second end view of the diode laser pump module shown in FIG. 1.
Figures 15, 16:
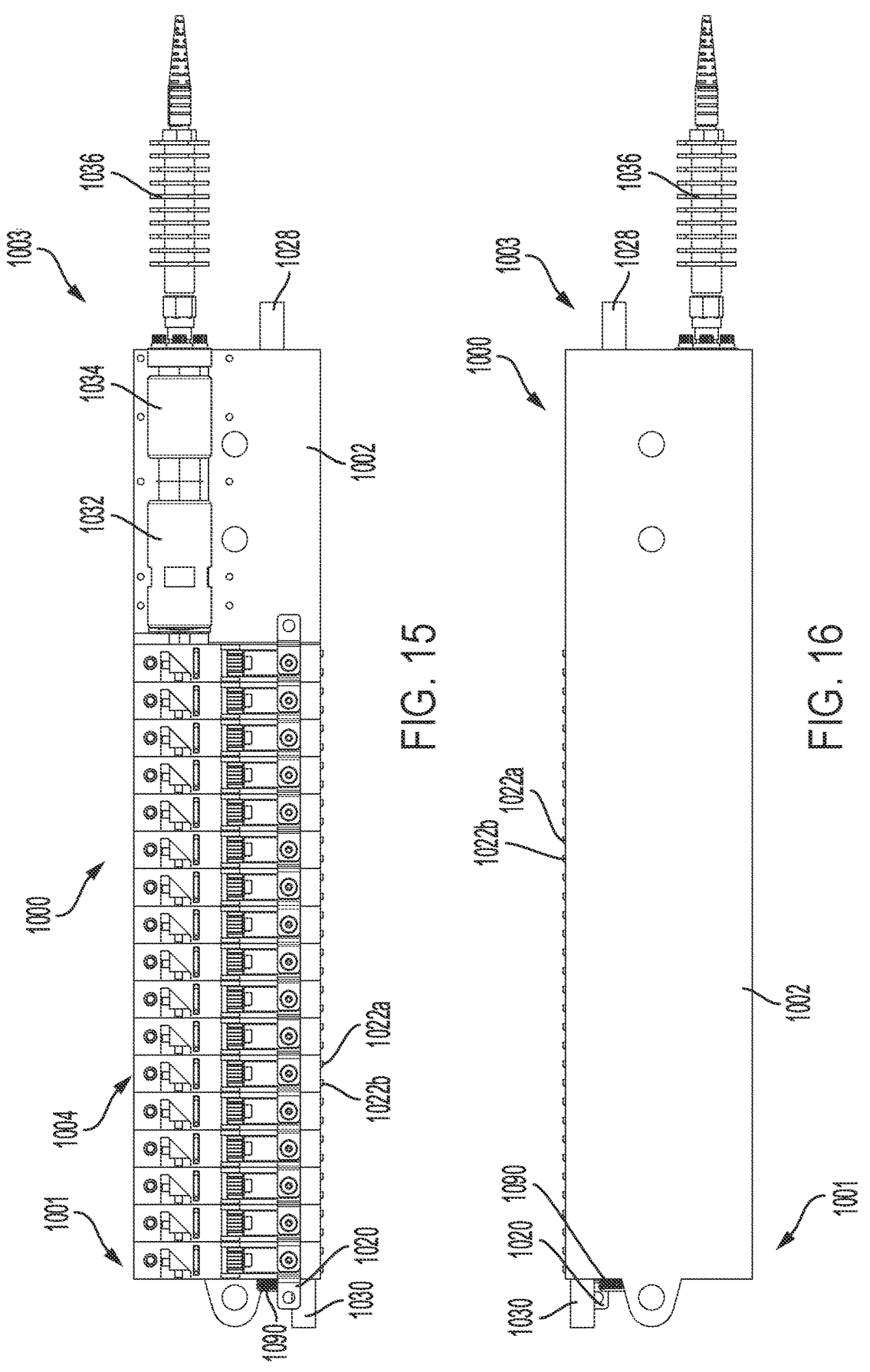
FIG. 15 is a top view of the diode laser pump module shown in FIG. 1.
FIG. 16 is a bottom view of the diode laser pump module shown in FIG. 1.

FIGS. 11 and 12 are side views of the diode laser pump module 1000 showing the staircase configuration of the diode laser pump module 1000. FIGS. 13 and 14 are front and back views of the diode laser pump module 1000, where FIG. 13 shows the manifold outlet tube 1030 from the staircase manifold 1002 within the manifold inlet tube 1028 the outlet channel 1052. FIG. 15 is a top view of the diode laser pump module 1000. The diode laser pump module 1000 comprises the staircase manifold 1002. On the top surface of the staircase manifold 1002 is the focuser relay barrel 1032, the relay barrel 1034, and the fiber connector mode stripper 1036. Also on the top surface of the staircase manifold are the plurality of TOGP 1004. FIG. 16 is the bottom view of the diode laser pump module 1000.

With reference now to FIGS. 11-16, at one end 1001 of the diode laser pump module 1000, the manifold outlet tube 1030 protrudes from the end of the staircase manifold 1002. At an opposite end 1003 of the diode laser pump module 1000, the manifold inlet tube 1028 protrudes from the end of the staircase manifold 1002. At the opposite end of the manifold outlet tube 1030 is a pressure pipe fitting 1090. The coolant is circulated through the staircase manifold 1002 at a flowrate selected from a range of 0.1 gallons per minute (GPM) to 1.0 GPM and preferably less than 0.5 GPM while delivering an optical power greater than 500 Watts.

Figure 17:
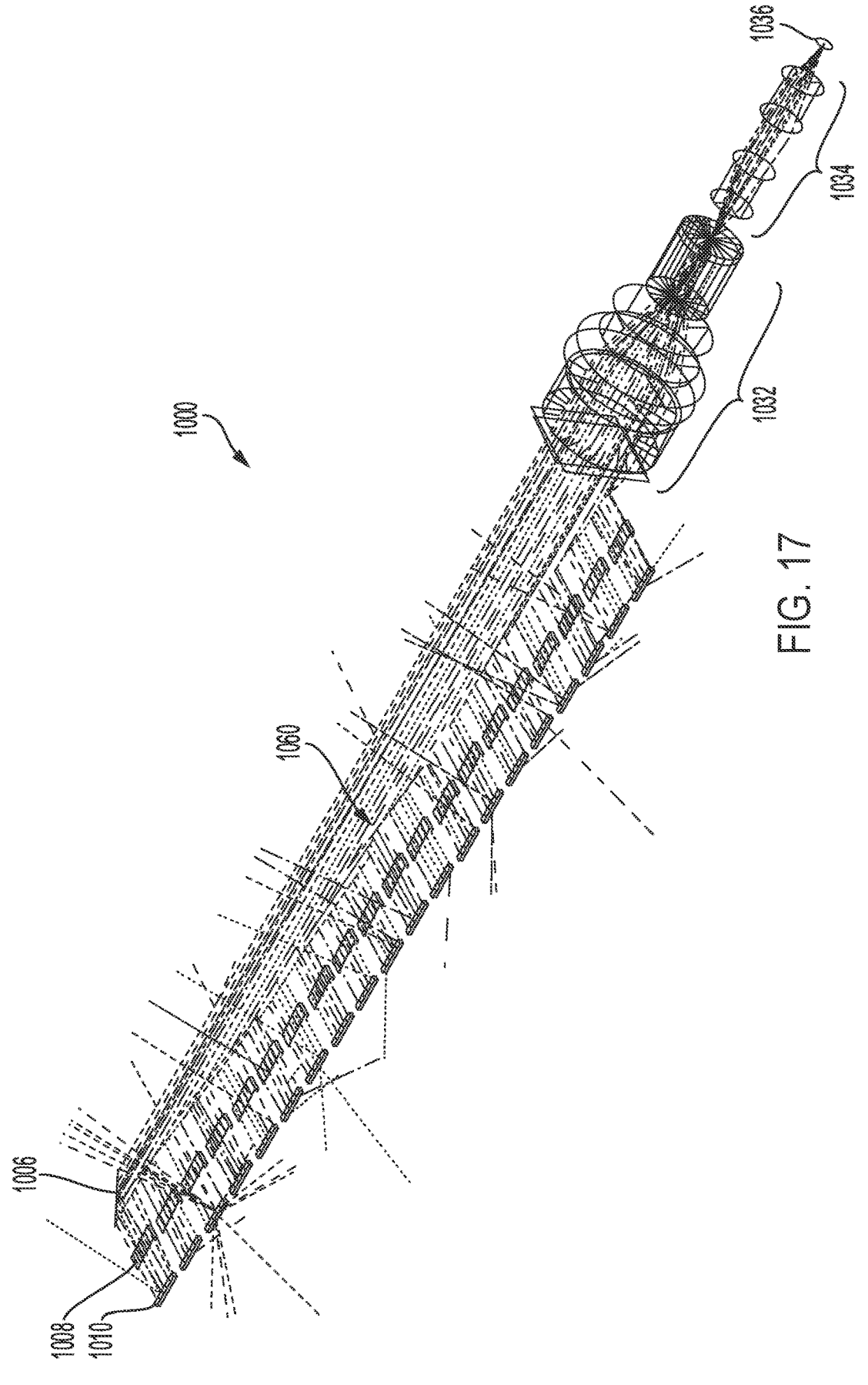
FIG. 17 is a schematic diagram of focusing optics of the diode laser pump module shown in FIG. 1 focusing photons generated by multiple arrays of diode laser devices.

FIG. 17 is a schematic diagram of collimating and focusing optics of the diode laser pump module 1000 shown in FIG. 1 collimating and focusing photons 1060 generated by multiple arrays of diode laser devices 1066. As shown in FIG. 17, the photons 1060 emitted by each of the diode laser devices 1066 travel from an output facet of the diode laser device 1066 to the FAC 1010. The FAC 1010 collimates the vertical fast diverging beam of photons 1060. The photons 1060 then travel from the FAC 1010 to the SAC 1008. The SAC 1008 collimates the horizontal slow diverging beam of photons 1060. The photons 1060 then travel from the SAC 1008 to the turning prism 1006. The turning prism 1006 changes the direction of the photons 1060 by 90 degrees. The photons 1060 travel along the longitudinal length of the diode laser pump module 1000 to the focuser lens barrel 1032 to the relay barrel 1034. From the relay barrel 1034, the photons 1060 travel to the fiber connector mode stripper 1036 to form mode stripped light with numerical aperture (NA) less than 0.22 onto a single delivery fiber with diameter of 225 μm or less. The turning prism 1006 can change the direction of the photons 1060 at any applicable angle.

The connector mode stripper 1036 couples the single laser beam into a single core delivery fiber optic with diameter of 225 μm or less. The diode pump module 1000 is thus configured to collimate and focus photons 1060 from the plurality of diode laser devices 1066 of the laser pump module 1000 onto a single fiber optic with diameter of 225 μm or less and with numerical aperture (NA) less than 0.22. Multiple such fibers each delivering more than 500 Watts of optical power can be combined in a fiber combiner and used to pump a fiber laser. The diode pump module 1000 has specific volume of less than 0.7 cubic-centimeter/Watt and a specific weight of less than 0.7 gram/Watt to deliver an optical power greater than 500 Watts. The plurality of diode laser devices 1066 of the diode pump module 1000 are configured to couple the combined optical power to a single optical fiber having a core that is selected from a range of 100 μm to 225 μm with a numerical aperture less than 0.22.

Figure 18:
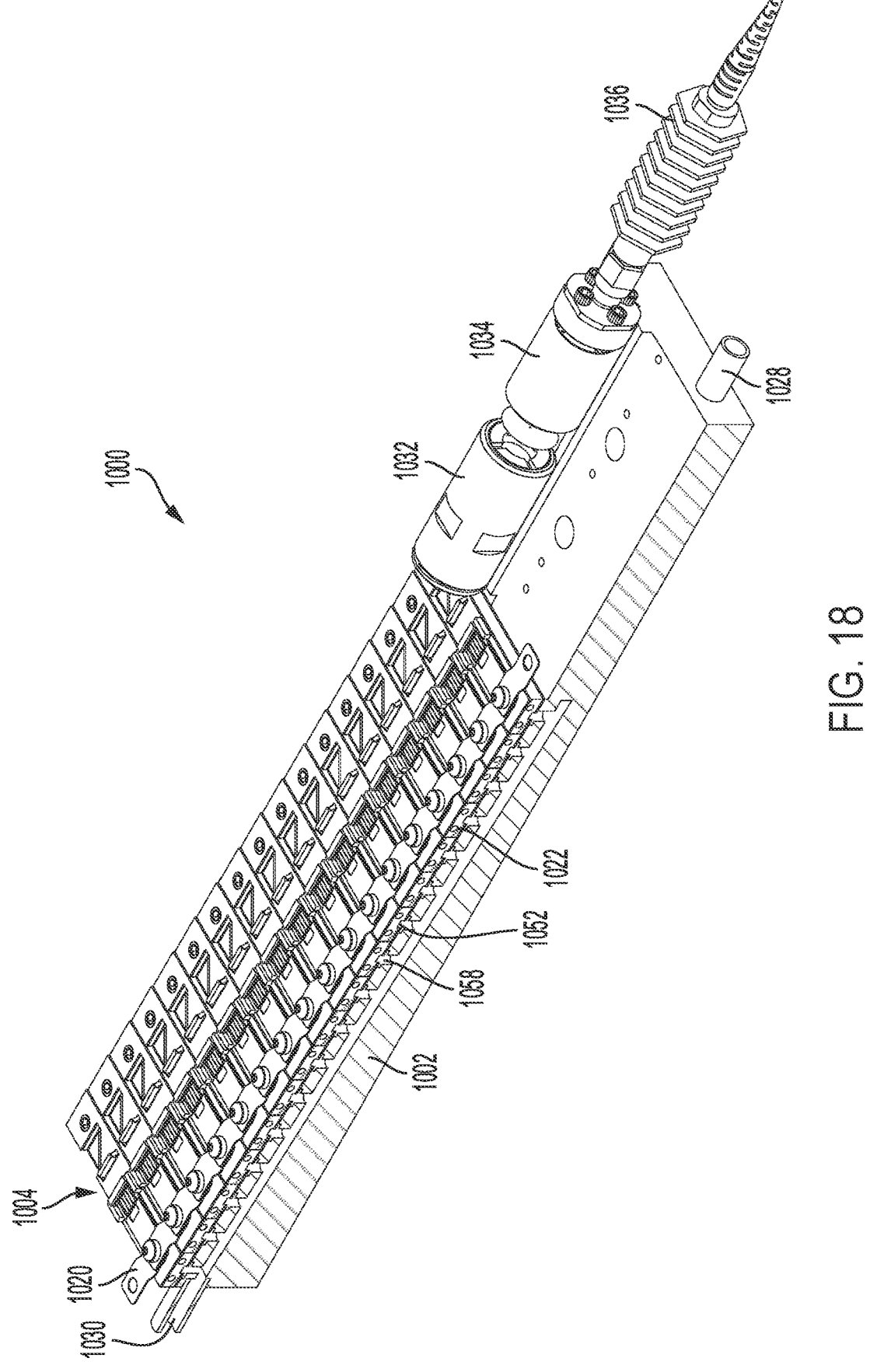
FIG. 18 is a cross-sectional perspective view of the diode laser pump module shown in FIG. 1 taken through a manifold outlet tube.
Figures 19, 20:
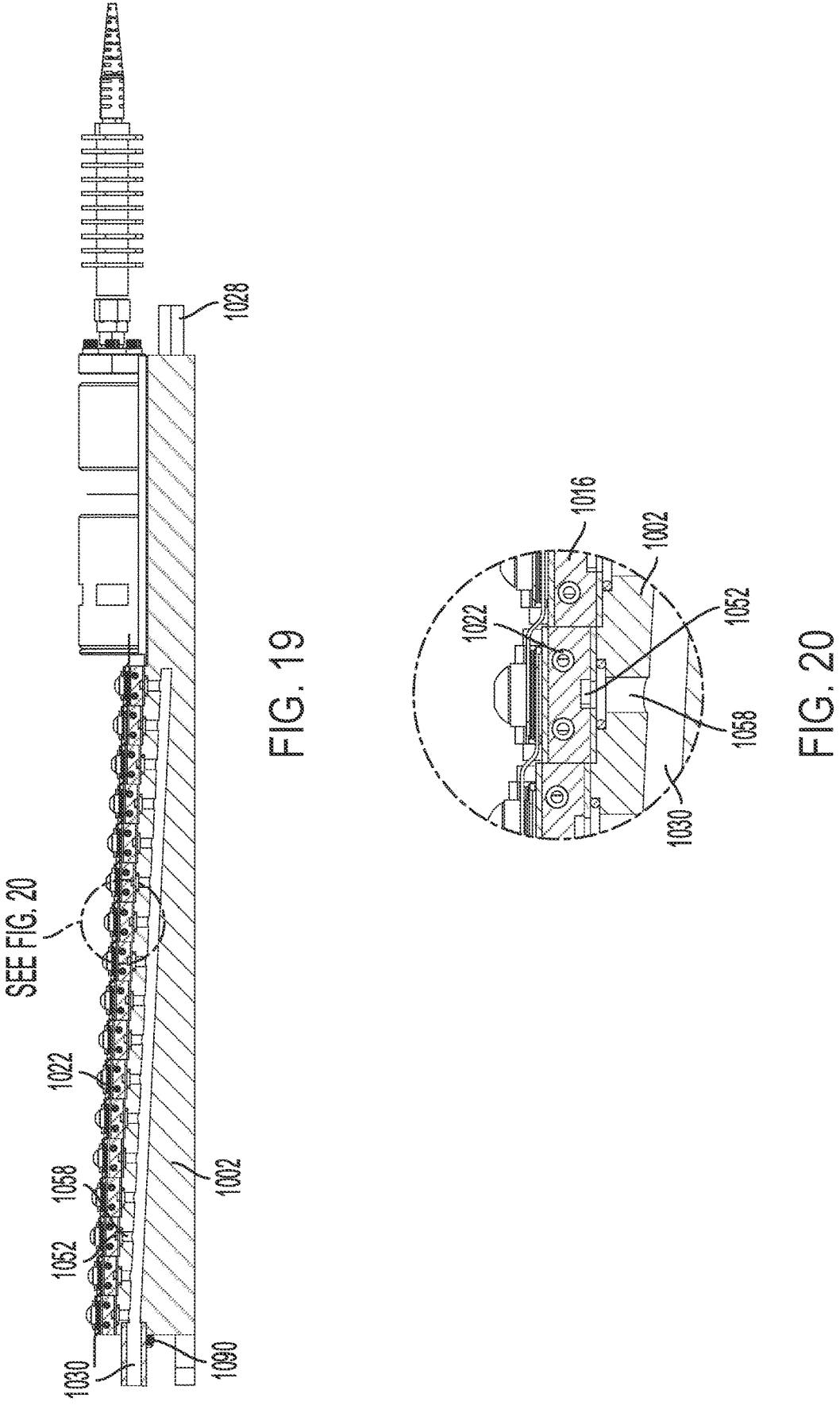
FIG. 19 is a side cross-sectional view of the diode laser pump module shown in FIG. 18.
FIG. 20 is a magnified view of a portion of the diode laser pump module shown in FIG. 19.

FIG. 18 is a cross-sectional perspective view of the diode laser pump module 1000 shown in FIG. 1 taken through the manifold outlet tube 1030. FIG. 19 is the side view of the cross-section view of the diode laser pump module 1000 shown in FIG. 18. The manifold outlet tube 1030 connects to the plurality of staircase manifold outlet channels 1058. The coolant exits the TOGP 1004 from the TOGP channel 1072 (see FIGS. 4-10) through an outlet channel 1052. The coolant then flows down the staircase manifold outlet channel 1058 and into the manifold outlet tube 1030. The coolant then exits the manifold through the manifold outlet tube 1030.

FIG. 20 is a detailed view of FIG. 19 that illustrates the fluid connection between the manifold outlet tube 1030, the staircase manifold outlet channels 1058, and the output channel 1052. Coolant fluid from the channel 1072 flows through the outlet channel 1052, exiting the TOGP 1004. The coolant then flows through the staircase manifold outlet channels 1058 and into the manifold outlet tube 1030 where the coolant exits the diode laser pump module 1000.

FIG. 21 illustrates a cross-section of the diode laser pump module at the manifold inlet tube 1028. FIG. 22 is a side view of the cross-section of the diode laser pump module 1000, where the cross-section occurs at the manifold inlet tube 1028. The manifold inlet tube 1028 extends through the one end 1001 of the staircase manifold 1002 to the other end 1003 of the staircase manifold 1002. The manifold inlet tube 1028 stops at the compact pressure steel pipe fitting 1090. The pressure steel pipe fitting 1090 is connected to the one end 1001 of the manifold inlet tube 1028. As shown, the manifold inlet tube 1028 is fluidically coupled to a plurality of manifold inlet channels 1056. The manifold inlet channels 1056 are fluidically coupled to the manifold inlet tube 1028 of the inlet channel 1050.

The coolant flows through the inlet channel 1050 into each manifold inlet channels 1056. The coolant then flows through the inlet channel 1050 into the channels 1072 (see FIGS. 4-10) of each TOGP 1004 of the diode laser pump module 1000. The plurality of manifold inlet channels 1056 correspond to the plurality of TOGP 1004. Each of the plurality of manifold inlet channels 1056 connect to a corresponding inlet channel 1050 to facilitate the flow of coolant from the staircase manifold 1002 to each channel 1072.

FIG. 23 is a detailed view of FIG. 22 that illustrates the fluid connection between the manifold inlet tube 1028, the manifold inlet channels 1056, and the inlet channel 1050. Coolant fluid from the manifold inlet tube 1028 flows into the manifold inlet channels 1056. The coolant fluid then flows from the manifold inlet channels 1056 through the corresponding inlet channel 1050. From there the coolant fluid flows through the corresponding channels 1072 of the individual TOGPs 1004.

In one aspect, the manifold inlet tube 1028 receives the coolant fluid and flows the coolant fluid through the manifold inlet tube 1028. The manifold inlet tube 1028 defines a plurality of manifold inlet channels 1056 that fluidically couple the manifold inlet tube 1028 to the channels 1072 of each of the plurality of TOGPs 1004. For example, the first TOGP 1004 is fluidically coupled to the manifold inlet tube 1028. The coolant fluid then flows into the manifold inlet channels 1056 and into the TOGP inlet channel 1050. The coolant fluid then flows through each of the TOGPs 1004 via the corresponding channels 1072. The coolant fluid exits the TOGP 1004 through the outlet channel 1052. The coolant fluid then flows down the staircase manifold outlet channel 1058 and into the manifold outlet tube 1030. The coolant fluid then exits the diode laser pump module 1000 through the manifold outlet tube 1030.

Figure 24:
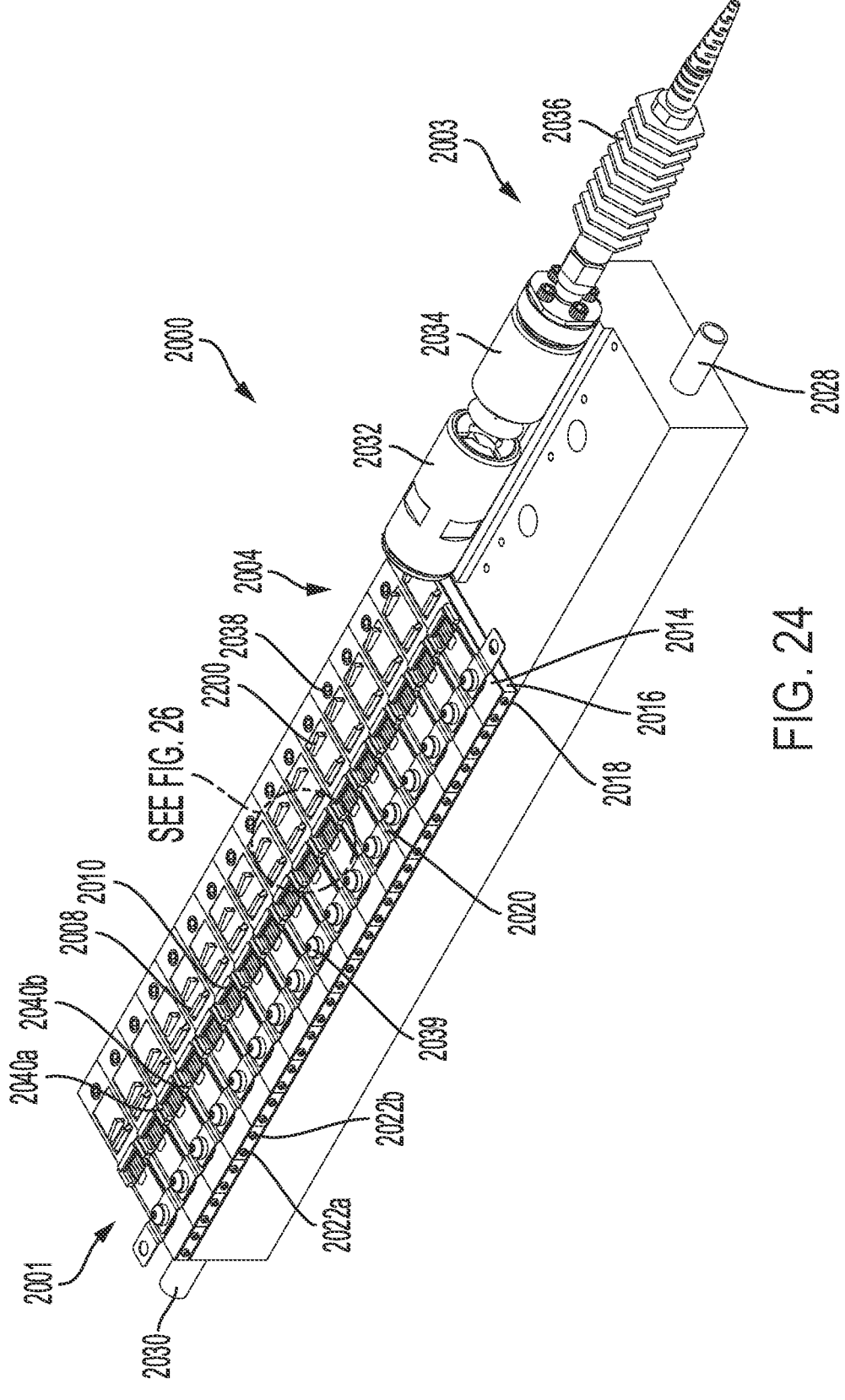
FIG. 24 is a perspective view of a diode laser pump module with a planar manifold structure and a plurality of thermo-optical ground planes according to at least one aspect of the present disclosure.
Figure 25:
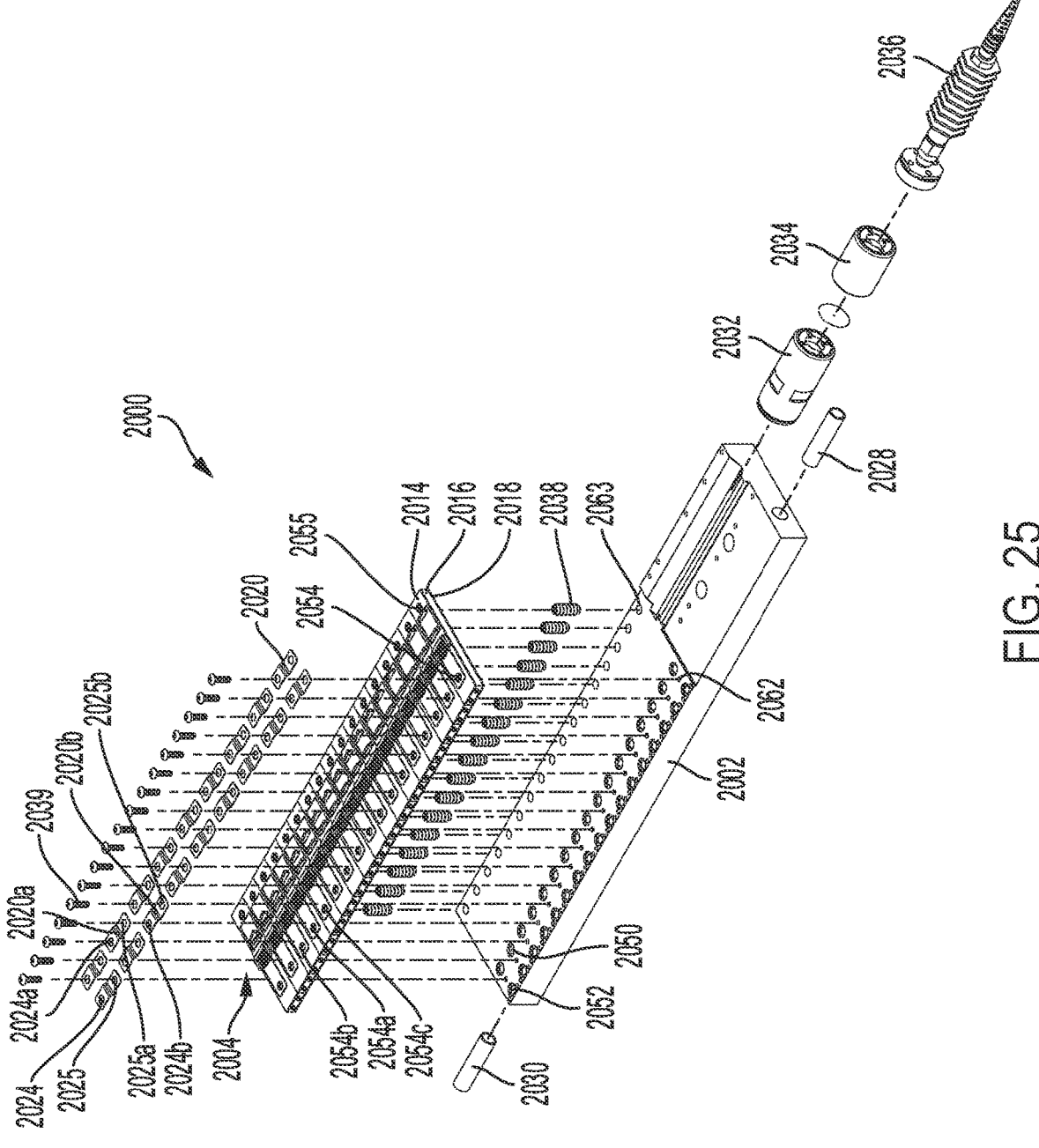
FIG. 25 is an exploded view of a diode laser pump module with a planar manifold structure and a plurality of thermo-optical ground planes according to at least one aspect of the present disclosure.

Turning now to FIG. 24, FIG. 24 is a perspective view of a diode laser pump module 2000 with a substantially same plane manifold structure. FIG. 25 is an exploded view of the diode laser pump module 2000 shown in FIG. 24. In the substantially same plane manifold structure shown in FIG. 24, a plurality of thermo-optical ground planes (TOGPs) 2004 are attached to the top surface of the substantially same plane manifold 2002. Also attached to the top surface of the substantially same plane manifold 2002 are a focuser lens barrel 2032, a relay barrel 2034, and a connector mode stripper 2036. The substantially same plane manifold structure enables the optical power from the plurality of TOGPs 2004 to be combined and to achieve fiber coupling into a single optical power delivery fiber.

Within the substantially same plane manifold 2002 is a manifold inlet tube 2028 and a manifold outlet tube 2030. The manifold inlet tube 2028 extends through the substantially same plane manifold 2002 underneath each TOGP 2004. The manifold inlet tube 2028 receives a coolant to distribute to each TOGP 2004. The manifold outlet tube 2030 extends through the substantially same plane manifold 2002 underneath each TOGP 2004. The manifold outlet tube 2030 releases the coolant after it has been distributed throughout the substantially same plane manifold 2002.

The substantially same plane manifold defines a plurality of first manifold mounting holes and a plurality of second manifold mounting holes. The substantially same plane manifold defines a first manifold mounting hole 2062 and a second manifold mounting hole 2063 to connect a TOGP 2004 to the substantially same plane manifold 2002. The substantially same plane manifold 2002 defines a plurality of first manifold mounting holes 2062 and second manifold mounting holes 2063 corresponding to the number of TOGPs 2004.

The TOGP 2004 defines a first TOGP mounting hole 2054 and a second TOGP mounting hole 2055. The first TOGP mounting hole 2054 corresponds to the first manifold mounting hole 2062. The second TOGP mounting hole 2055 corresponds to the second manifold mounting hole 2063.

The first manifold mounting hole 2062 and the first TOGP mounting hole 2054 receive a first screw 2038. The second manifold mounting hole 2063 and the second TOGP mounting hole 2055 receive a second screw 2039. A plurality of first and second screws 2038, 2039 attach the plurality of TOGPs 2004 to the substantially same plane manifold 2002. Other fasteners for attaching the plurality of TOGPs 2004 to the substantially same plane manifold 2002 may be employed.

A first TOGP 2004*a* is connected to a second TOGP 2004*b* by a diode plate electrical interconnect 2020. The first diode plate electrical interconnect 2020*a* defines a first hole 2024*a* and a second hole 2025*a*. The first hole 2024*a* of the diode plate electrical interconnect 2020*a* is placed over the first TOGP mounting hole 2054*b* of the second TOGP 2004*b*. The second mounting hole 2025*a* of the diode plate interconnect 2025*a* is placed over the first TOGP mounting hole 2054*a* of the first TOG 2004*a*.

A second diode plate electrical interconnect 2020*b* defines a first hole 2024*b* and a second hole 2024*b*. The second diode plate electrical interconnect 2020*b* connects the first TOGP 2004*a* to a third TOGP 2004*c*. The first hole 2024*b* of the diode plate electrical interconnect 2020*b* is placed over the first TOGP mounting hole 2024*b* of the first TOGP 2054*a*. The second hole 2024*b* of the diode plate electrical interconnect 2025*b* is placed over the first TOGP mounting hole of the third TOGP 2062*c*. The plurality of screws 2039 connect the first diode plate electrical interconnect 2020*a*, the second diode plate electrical interconnect 2020*b*, and the substantially same plane manifold 2002. The plurality of screws 2039 extend through the first diode plate interconnect 2020*a*, the second diode plate interconnect 2020*b*, the TOGP 2004, and into the substantially same plane manifold 2002.

Figure 26:
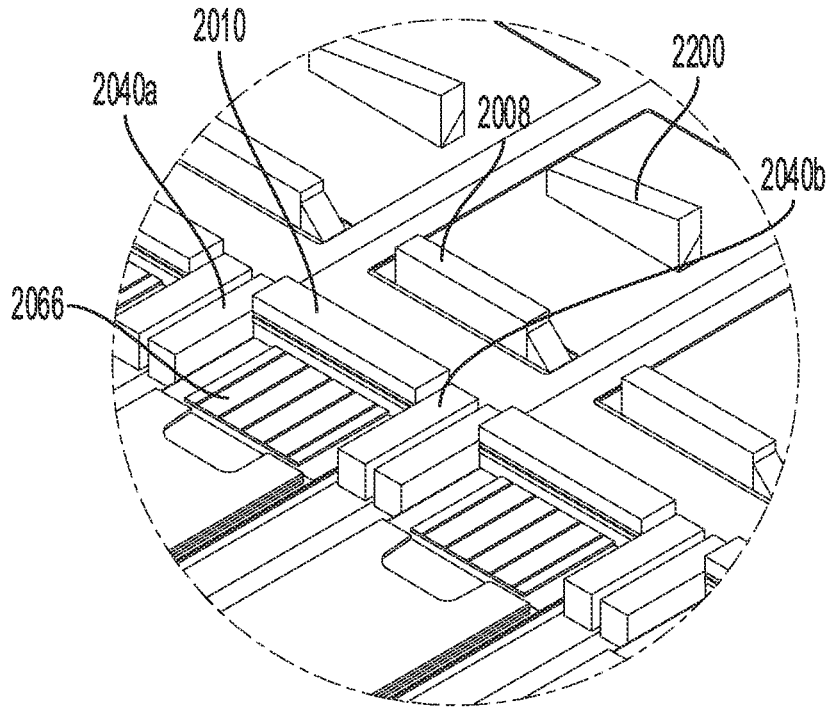
FIG. 26 is a magnified view of a portion of FIG. 24.
Figure 27:
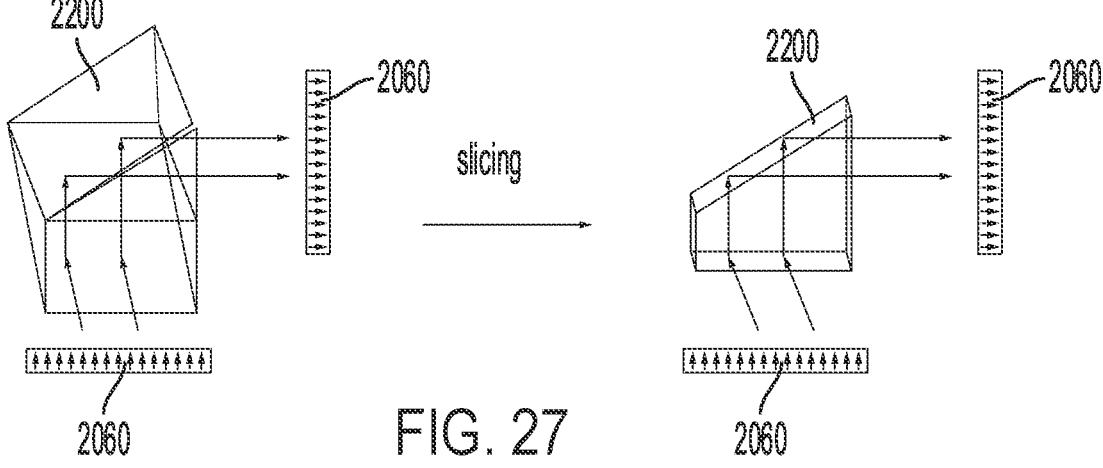
FIG. 27 is a rotating prism according to at least one aspect of the present disclosure.

With reference now to FIGS. 26-27, FIG. 26 is a detailed view of FIG. 24 that illustrates the rotating prism. The rotating prism is used to reorient the fast and slow axis directions of the collimated beam and enable attachment of TOGPs on a substantially same plane manifold rather than staircase manifold. FIG. 27 illustrates the path along which the photons 2060 travel from the diode laser device 2066 to the rotating prism 2200, as shown by the arrows. The photons 2060 emitted by the diode laser device 2066 travel from an output facet through the FAC 2010. From the FAC 2010 the photons 2060 travel along the longitudinal axis of the TOGP 2004 to the SAC 2008. From the SAC 2008, the photons 2060 travel to the rotating prism 2200 and are redirected at a right angle or 90 degrees to the longitudinal axis of the TOGP 2004. Accordingly, the photons 2060, which originally traveled along the longitudinal axis of the TOGP 2004, travel in a direction perpendicular to the TOGP 2004 after being redirected by the rotating prism 2200. After the photons 2060 are redirected perpendicular to the TOGP 2004, the photons 2060 travel along the length of the diode laser pump module 2000 (FIG. 24) to beam shaping optics. It will be appreciated that the photons may be redirected at any predetermined angle relative to the longitudinal axis.

With reference now to FIGS. 28-34, FIG. 28 is a detailed view of the TOGP 2004 that illustrates the flow of photons emitted by the diode laser device array. The TOGP 2004 comprises a first plate 2014, a body 2016, and a second plate 2018. The body 2016 is located between the first and second plates 2014, 2018. At a first end of the TOGP 2004, a first mounting hole 2054 is disposed, nearest to sub-mount plate 2068 configured to receive a diode laser device 2066 mounted thereon. At least one electrical conductor 1064 is disposed on the top surface of the diode laser device to establish electrical connection to diode laser device 1066. In various aspects, the electrical conductor 1064 may be one or more wire bonds, one or more ribbons, or conducting copper foil. At a second end of the TOGP 2004, a second mounting hole 2055 is disposed, nearest to a rotating prism 2200. The first mounting hole 2054 and the second mounting hole 2055 extend through the first plate 2014, the body 2016, and the second plate 2018. The sub-mount plate 2068 provides electrical insulation of the diode laser device from the TOGP 2004 and consists of any high thermal conductivity metalized ceramics such as aluminum nitride or beryllium oxide. Metallization on the ceramics is copper followed by nickel and gold.

The first plate 2014 is configured to mount beam shaping optics. The beam shaping optics can be, but are not limited to, a fast axis collimator (FAC) 2010, a slow axis collimator (SAC) 2008, and a rotating prism 2200. The first plate 2014 also comprises a sub-mount plate 2068 for mounting a diode laser device 2066 thereon. It will be appreciated by those skilled in the art that diode laser device 2066 may be referred to as a mini-bar diode laser comprising multiple diode laser emitters. In one aspect of the present disclosure, the diode laser device 2066 may comprise five diode laser emitters. The diode laser device 2066 may be attached to the first plate 2014 or the sub-mount plate 2068 using solder or other suitable low thermal resistance attachment methods. The diode laser device 2066 is in thermal communication with the sub-mount plate 2068. The sub-mount plate 2068 is in thermal communication with the first plate 2014.

The FAC 2010 collimates the vertical fast diverging laser beam. The SAC 2008 collimates the horizontal slow diverging laser beam. The optical elements are attached to the first plate 2014 using epoxy such as UV curable epoxy or solder such as indium solder, or other suitable attachment methods.

Figure 28:
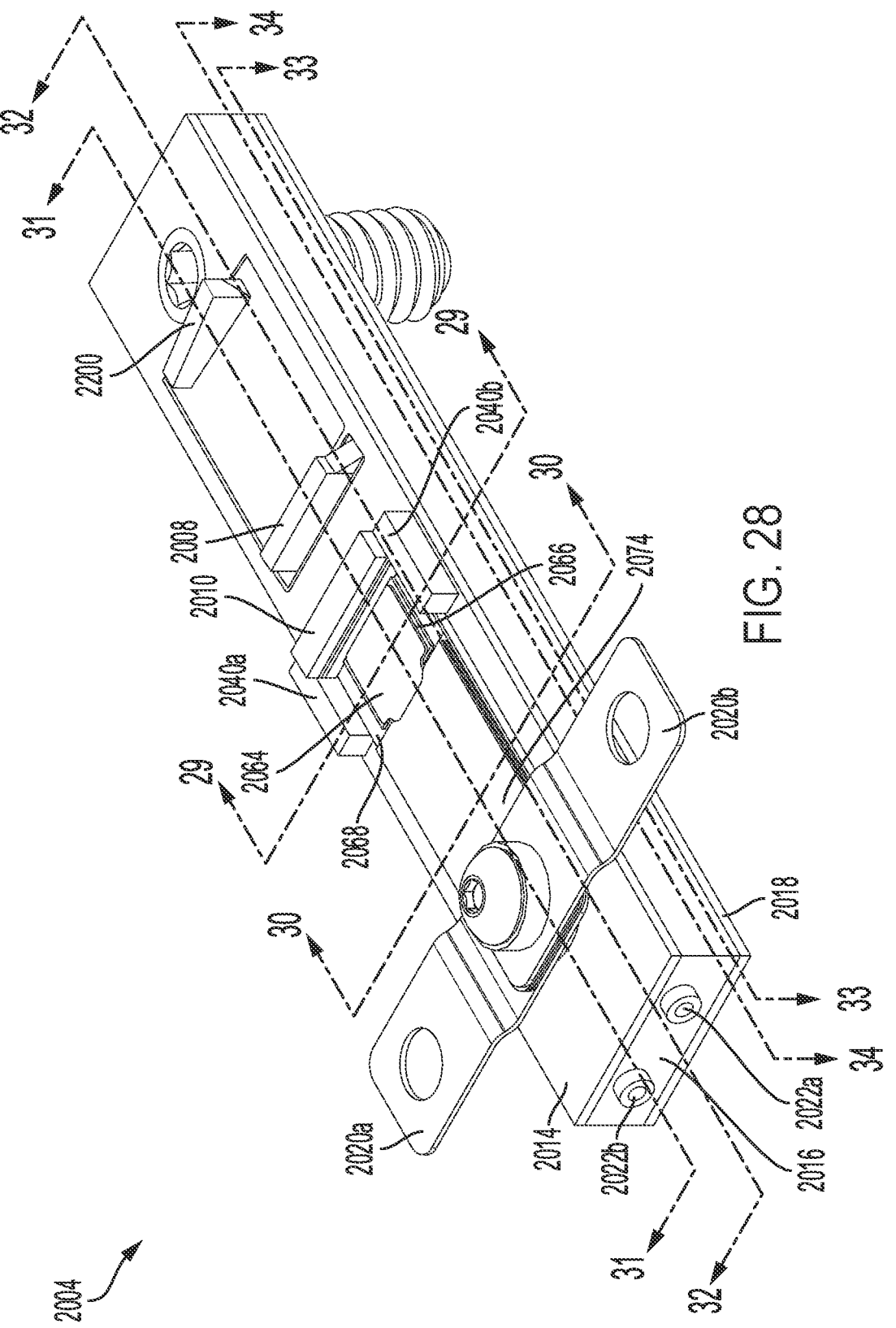
FIG. 28 is a detailed perspective view of the thermo-optical ground plane according to at least one aspect of the present disclosure.

With reference to FIG. 28, at a first end of the TOGP 2004, a first tube 2022*a* and a second tube 2022*b* extend outwardly from the body 2016. (Further shown in FIG. 32). Working fluid may be introduced to the evaporation chamber 2088 through the first and second tubes 2022*a*, 2022*b* as described below.

Still with reference to FIG. 28, disposed on the top surface of the first plate 2014, the FAC 2010 is held in place by FAC retainers 2040*a*, 2040*b*. The FAC retainers 2040*a*, 2040*b* are positioned on opposite sides of the FAC 2010. In one aspect, the FAC retainers 2040*a*, 2040*b* extend past the FAC 1010 to the sides of the diode laser diode laser sub-mount plate 2068.

Figures 29, 30:
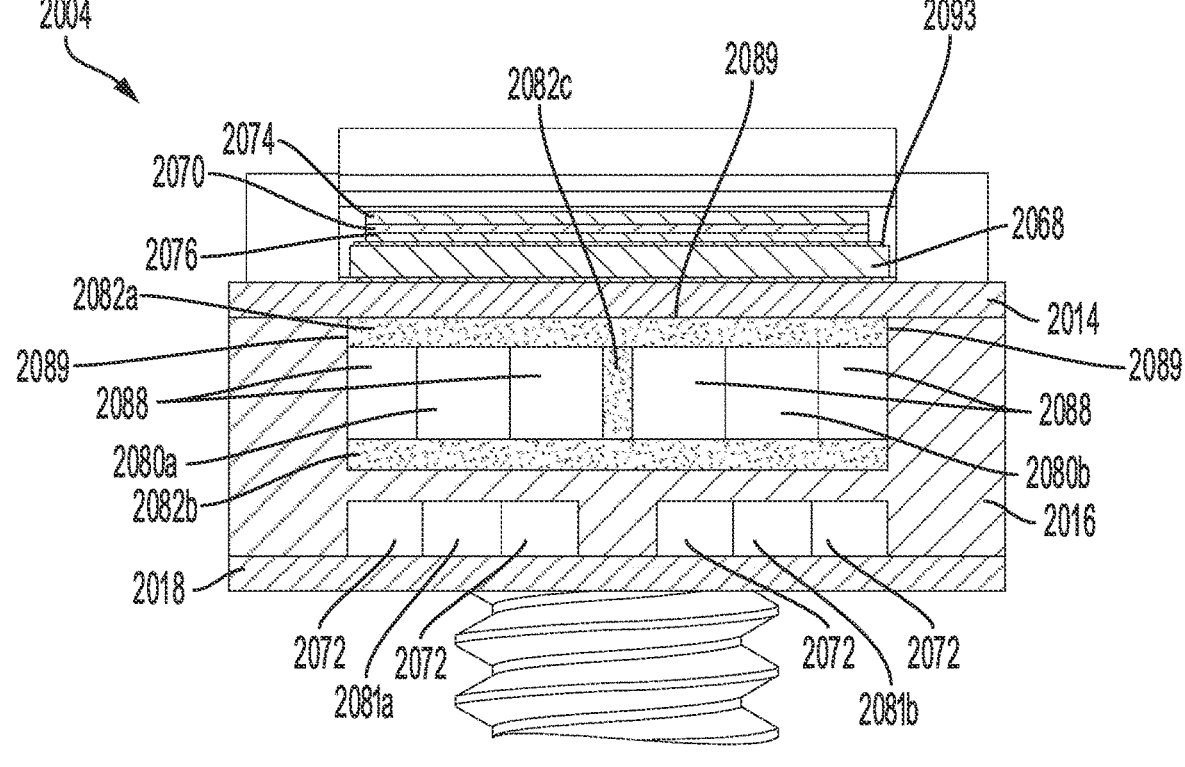
FIG. 29 is a cross-sectional view of the thermo-optical ground plane shown in FIG. 28 taken through section 29-29.
FIG. 30 is a cross-sectional view of the thermo-optical ground plane shown in FIG. 28 taken through section 30-30 through an interconnect lead top.

With reference now to FIGS. 29-30, disposed on the first plate 2014 is a diode laser sub-mount plate 2068 that is in thermal communication with the first plate 2014. The diode laser device 2066 is mounted to and is in thermal communication with the diode laser sub-mount plate 2068. Disposed on a top surface of the diode laser sub-mount plate 2068 is an electrical interconnect lead 2076. The interconnect lead 2076 connects to the screw 2039. Disposed on the top surface of the interconnect lead 2076 is a lead insulator 2070. Disposed on a top surface of the lead insulator 2070 is the interconnect lead top 2074. The interconnect lead 2074 is in electrical communication with the bottom of the diode laser device 2066 established through the diode laser sub-mount plate 2068. The interconnect lead top 2074 is in electrical communication with the top of the diode laser device 2066 established through the electrical conductor 2064.

With reference to FIGS. 28-34, the TOGP 2004 comprises an evaporation chamber 2088. The evaporation chamber 2088 is defined between the body 2016 and the first plate 2014. The evaporation chamber 2088 is configured to receive a working fluid through the first and second tubes 2022*a*, 2022*b*. For example vacuum is applied to the first tube 2022*a* and working fluid such as degassed water is precisely metered through the second tube 2022*b*. After sufficient amount of working fluid is introduced into the evaporation chamber 2088, both tubes 1022*a* and 1022*b* are permanently terminated using for example a pinch-off tool. The evaporation chamber 2088 comprises a porous medium 2082*a*, 2082*b*, 2082*c* to hold the working fluid and to transport the working fluid by capillary action from the condenser porous medium 2082*b* to evaporator porous medium 2082*a* via one or more porous medium posts 2082*c*. The evaporation chamber 2088 is in thermal communication with the diode laser sub-mount plate 2068 and the diode laser device 2066. Heat generated by the diode laser device 2066 vaporizes the working fluid in the evaporator porous medium 2082*a* and transfers the vapor to the condenser porous medium 2082*b* where it condenses and rejects the heat to cooling channel 1072. The surface area of the condenser porous medium 2082*a* is at least ten-times greater than the surface area 2091 of the diode laser device 2066 or the surface area 2093 of the diode laser sub-mount plate 2068 making evaporation chamber very effective heat flux transformer which greatly reduces the heat flux of the diode laser device 2066 into much lower heat flux that enter cooling channel 1072 enabling drastic reduction in flowrate requirement through channel 1072. The heat generated by the diode laser device 2066 is evenly dissipated over nearly the entire surface area of the second plate 2018 and the surface area defined by the evaporation chamber 2088.

A plurality of structural support members 2080*a*, 2080*b* are disposed within the evaporation chamber 2088. The structural support members 2080*a*, 2080*b* provide rigidity to the TOGP 2004. In one aspect, the structural support members 2080*a*, 2080*b* are made of the same material as the body 2016.

A cooling channel 2072 is defined between the body 2016 and the second plate 2018. The channel 2072 is configured to receive and circulate a coolant at a predetermined flowrate. The channel 2072 is positioned adjacent to and in thermal communication with the evaporation chamber 2088 to transfer heat from the evaporation chamber 2088 to the coolant circulating in the channel 2072. A plurality of heat transfer fins or pins 2081*a*, 2081*b* are disposed within the channel 2072 to increase the heat transfer surface area for transferring the heat to coolant and also to provide rigidity to the TOGP 2004.

High thermal conductivity is achieved through evaporation of the working fluid contained in the evaporation chamber 2088 underneath the first plate 2014 and the condensation of the vapor above the channel 2072 of the low-profile low-flowrate cooler. The working fluid is returned from the condenser porous medium 2082*b* to evaporator porous medium 2082*a* through capillary action. The working fluid is saturated in the porous medium 2082*a* and 2082*b*.

During operation, heat from the diode laser device 2066 vaporizes the working fluid contained in evaporator porous medium 2082*a* underneath the diode laser device 2066. The vapor spreads the heat over the surface area defined by the inner walls 2089 of the evaporation chamber 2088 that is substantially greater than the surface area 2091 of the diode laser device 2066 and is substantially greater that the surface 2093 of the diode laser sub-mount plate 2068. Vapor spreading inside evaporation chamber 2088 reduces heat flux from the diode laser device 2066 for more than at least ten times reducing the coolant flowrate requirement in channel 1072 for more than five times compared to the conventional cooling techniques that rely on heat removal with coolant directly under the diode laser device 2066. As a result, the size and weight of coolant pump and coolant reservoir for a diode pump module based on TOGP 2004 can be significantly reduced to provide significant weight and volume savings for a system level thermal management system.

The channel 2072 defines a large cross sectional area to facilitate the flow of coolant through the TOGP 2004 with minimum particulate filtration requirement. The channel 2072 facilitates the flow of the coolant through the TOGP 2004 in order for the working fluid contained in evaporation chamber 2088 to condense and to transfer the heat to the coolant flowing through the channel 2072. As the coolant flows through the channel 2072 at a low flowrate, it removes the heat as it flows through the TOGP 2004 and into the substantially same plane manifold 2002. In one aspect, the channel 2072 defines a width selected from a range from 0.5 mm to 2.0 mm and preferably greater than 0.7 mm to enable clog free operation of the circulating coolant. This large channel size compared to conventional sub 0.3 mm or even sub 0.05 mm is beneficial as it minimizes total cooling loop pressure drop and minimizes maintenance requirements associated with replacement of filter cartridges. In one aspect, the coolant is propylene-glycol-water or water, or any suitable coolant. In one aspect, the coolant flowrate in the channel 2072 for entire diode pump module based on multiple TOGP 1004 with total optical output power greater than 500 Watts may be selected from a range of 0.1 gallons per minute (GPM) to 1.0 GPM or preferably less than 0.5 GPM.

FIG. 31 is a cross-sectional view of the TOGP 2004 shown in FIG. 28 taken along section 31-31. With reference also to FIGS. 24-34 and 44-46, within the TOGP 2004 is defined an inlet channel 2050 to the channel 2072 and an outlet channel 2052 from the channel 2072. The inlet channel 2050 carries the coolant from a substantially same plane manifold inlet channel 2056 (see FIGS. 44-46) into the channel 2072. The outlet channel 2052 carries the coolant from the channel 2072 to a substantially same plane manifold outlet channel 2058 (see FIGS. 42-43).

Figure 44:
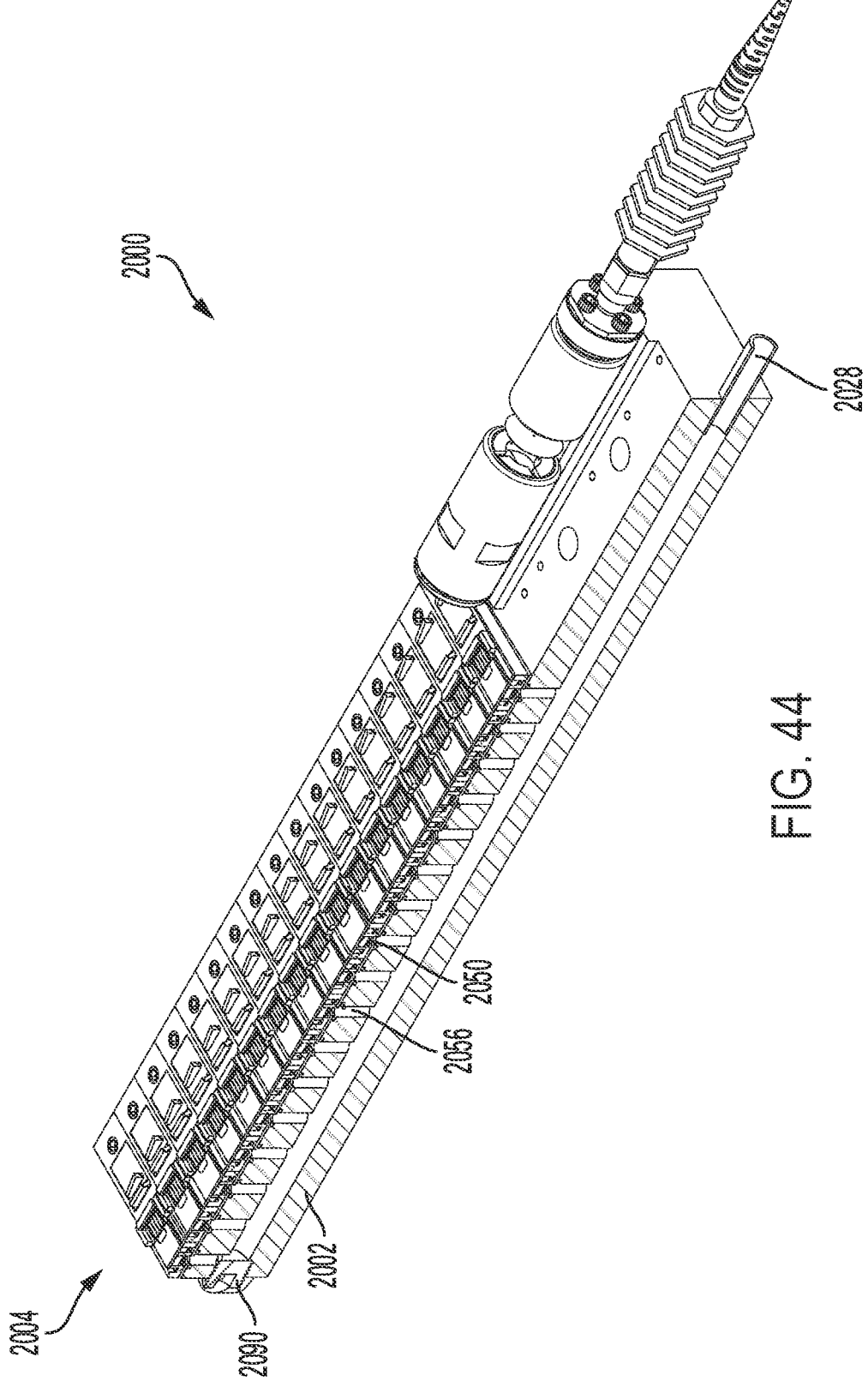
FIG. 44 is a cross-sectional perspective view of the diode laser pump module with flat manifold structure through an inlet tube.
Figures 45, 46:
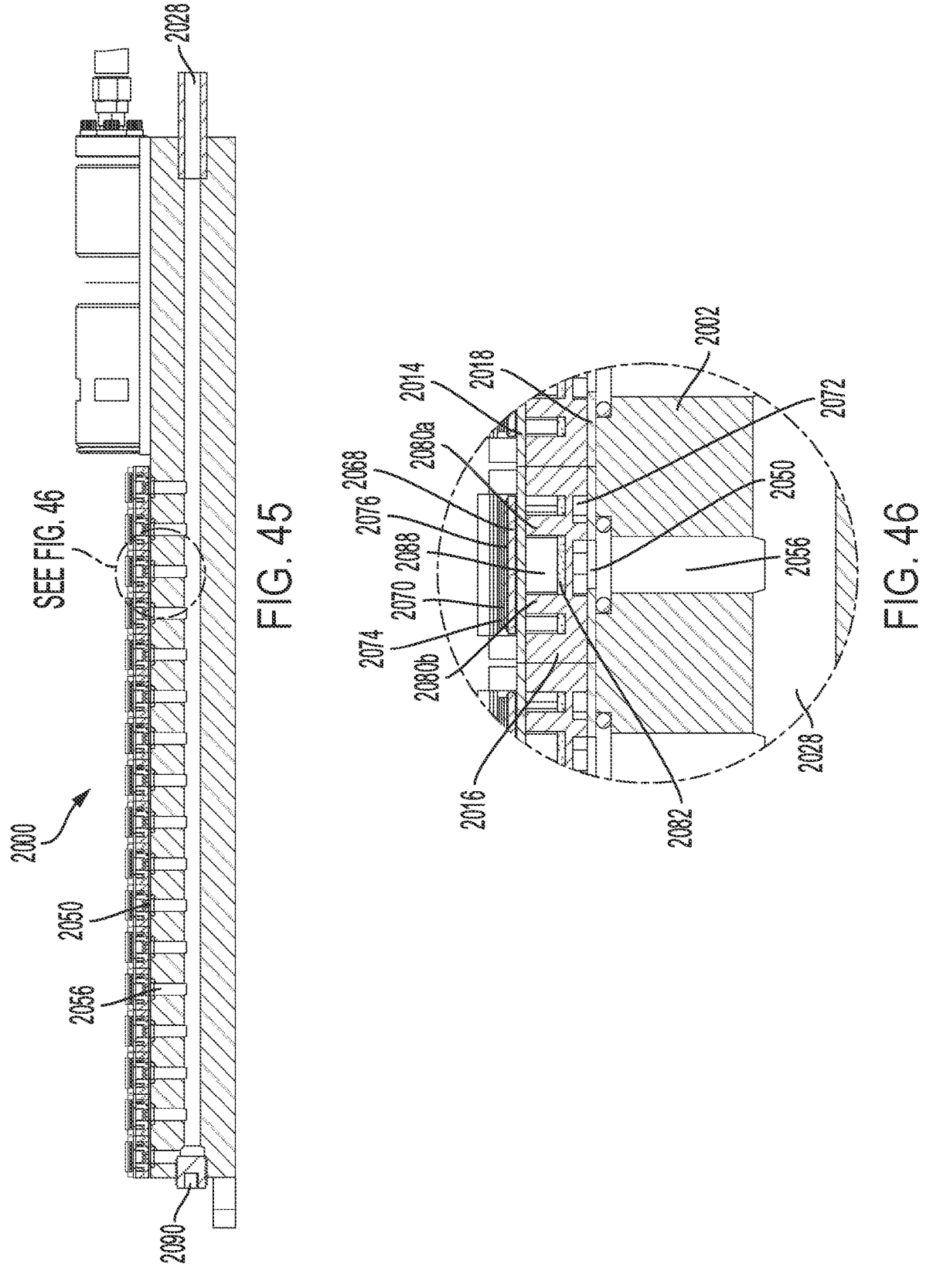
FIG. 45 is the cross-section of the diode laser pump module shown in FIG. 44 in a side view.
FIG. 46 is a magnified view of a portion of the diode laser pump module shown in FIG. 45.

Still with reference to FIGS. 24-34 and 44-46, the inlet channel 2050 extends through the second plate 2018 into the body 2016, where the inlet channel 2050 meets the channel 2072 (see FIGS. 45-46). The outlet channel 2052 extends through the second plate 2018 into the body 2016, where the outlet channel 2052 meets the channel 2072. The inlet channel 2050 is in fluid communication with the substantially same plane manifold inlet channel 2056 (see FIGS. 42-46). The outlet channel 2052 is in fluid communication with the substantially same plane manifold outlet channel 2058 (see FIGS. 44-46). The fluid coupling between the inlet channel 2050 and the substantially same plane manifold inlet channel 2056 facilitates the connection between the TOGP 2004 and the substantially same plane manifold for the coolant to flow into the TOGP 2004. The fluid coupling between the outlet channel 2052 and the substantially same plane manifold outlet channel 2058 facilitates the connection between the TOGP 2004 and the substantially same plane manifold for the coolant to flow out of the TOGP 2004. As shown in FIG. 31-32, the first and second tubes 2022*a* and 2022*b* include terminated ends 2023 at the end of the first and second tube 2022*a*, 2022*b* that extends out of the body 2016 of the TOGP 2004. The terminated ends 2023 are achieved through a cold pinch-off or crimping and welding of the end of the first and second tube 2022*a*, 2022*b* that extends out of the body 2016 of the TOGP 2004. The terminated ends 2023 ensure a good seal and air free evaporation/condensation inside evaporation chamber 2088.

Figures 33, 34:
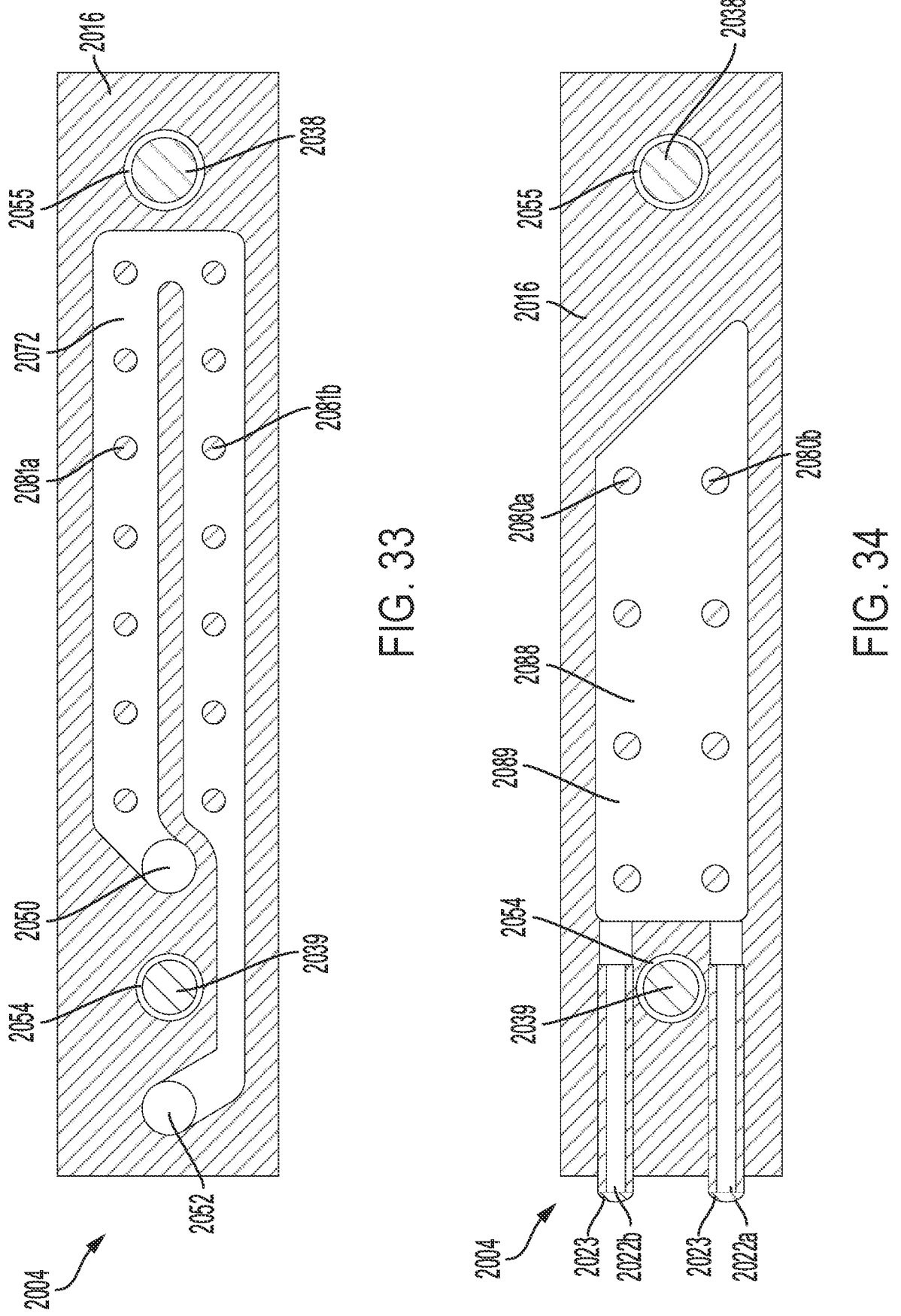
FIG. 33 is a cross-sectional view of the thermo-optical ground plane shown in FIG. 28 taken through section 33-3 through a coolant fluid channel.
FIG. 34 is a cross-sectional view of the thermo-optical ground plane shown in FIG. 28 taken through section 34-34 through an evaporation chamber.

FIG. 33 is a cross-sectional view of the TOGP 2004 shown in FIG. 28 taken along section 33-33 through the channel 2072 defined in TOGP 2004. As shown in FIG. 33, the TOGP cooling channel 2072 extends through the body 2016. The channel 2072 includes a plurality of heat conducting pins 2081a and 2081b that also serve as structural support elements to add rigidity to the TOGP 2004. The inlet channel 2050 fluidically couples to the channel 2072. The outlet channel 2052 fluidically couples to the channel 2072. The coolant flows through the inlet channel 2050 into the channel 2072. The coolant flows through channel 2072 to the outlet channel 2052 and then out through outlet channel 2052. As the coolant flows through the channel 2072, vapor in the evaporation chamber 2088 condenses and rejects the heat from the evaporation chamber 2088 to the coolant in the channel 2072. In this manner, the vapor in the evaporation chamber 2088 dissipates heat evenly to the channel 2072 as it is removed by the low flowrate circulating coolant.

FIG. 34 is a cross-sectional view of the thermo-optical ground plane shown in FIG. 28 taken along section 34-34 through the evaporation chamber 2088 defined by the TOGP 2004. As shown in FIG. 34, the evaporation chamber 2088 is a cavity that contains a plurality of structural support elements 2080a, 2080b to add rigidity to the TOGP 2004. The tubes 2022a, 2022b are fluidically coupled to the evaporation chamber 2088 to deliver working fluid to the evaporation chamber 2088 and are subsequently terminated through termination 2023. In one aspect, the working fluid can be degassed water. While the coolant flows through the channel 2072, below the evaporation chamber 2088, the evaporation chamber 2088 spreads the heat with vapor formation and vapor flow. High thermal conductivity is achieved through evaporation of the working fluid underneath the first plate 2014 that supports the sub-mount plate 2068 and the diode laser device 2066. The vapor in the evaporation chamber 2088 generated by the heat of the diode laser device 2066 is condensed by the flowing coolant in the low-profile cooler channel 2072 below the evaporation chamber 2088. The working fluid may be pumped from a condenser porous medium 2082b to evaporator porous medium 2082a in the evaporator chamber 2088 through capillary action (see FIGS. 29 to 32). One or more porous medium posts 2082c may be used to facilitate capillary return of liquid from condenser porous medium 2082b to evaporator porous medium 2082a. As shown in FIGS. 33 and 34, mounting holes 2054, 2055 receive screws 2038, 2039 respectively to fasten the TOGP 2004 to the plane manifold 2002.

Figures 35, 36:
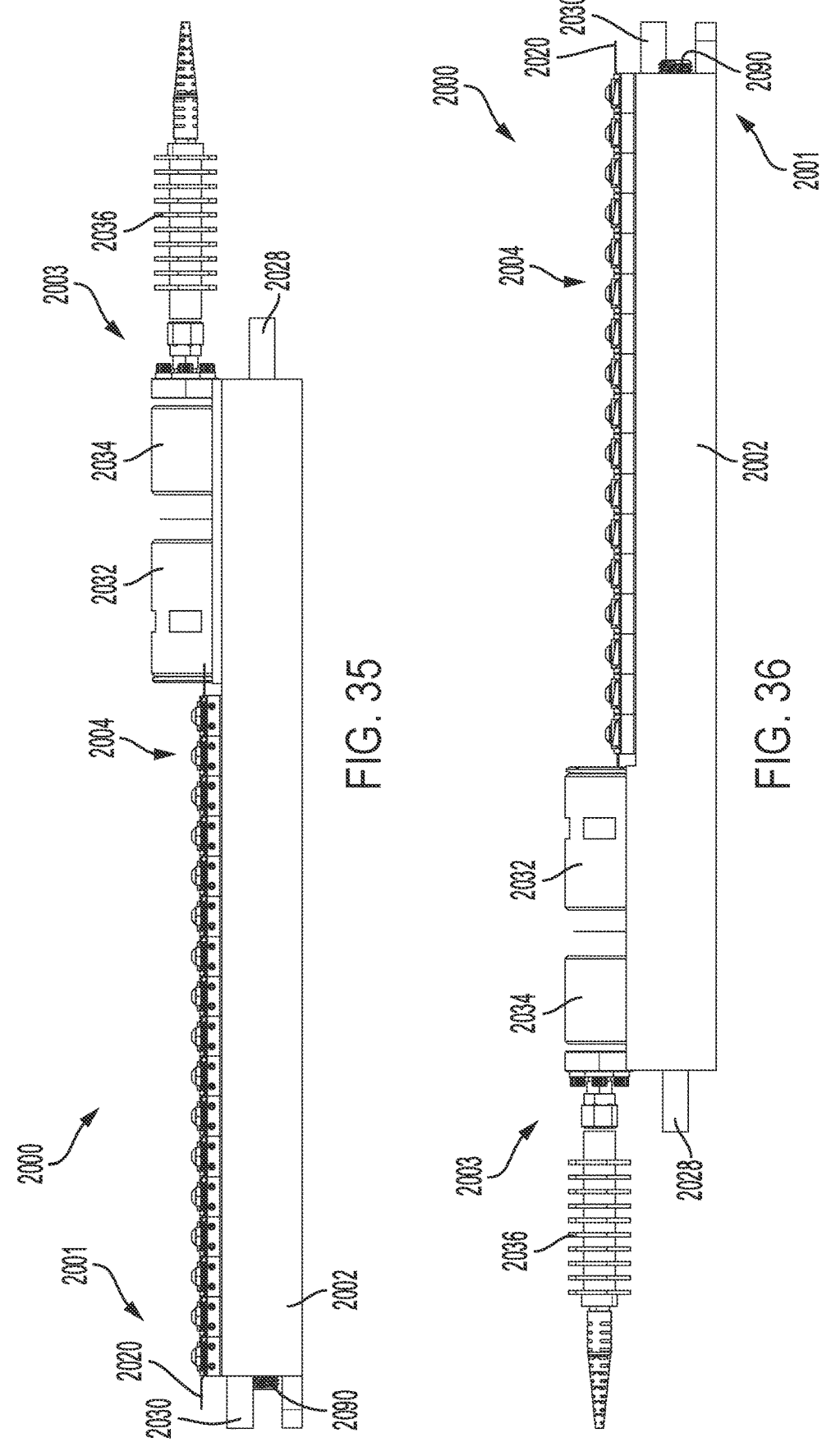
FIG. 35 is a side view of the diode laser pump module with a planar manifold structure.
FIG. 36 is a side view of the diode laser pump module with a planar manifold structure.
Figure 37:
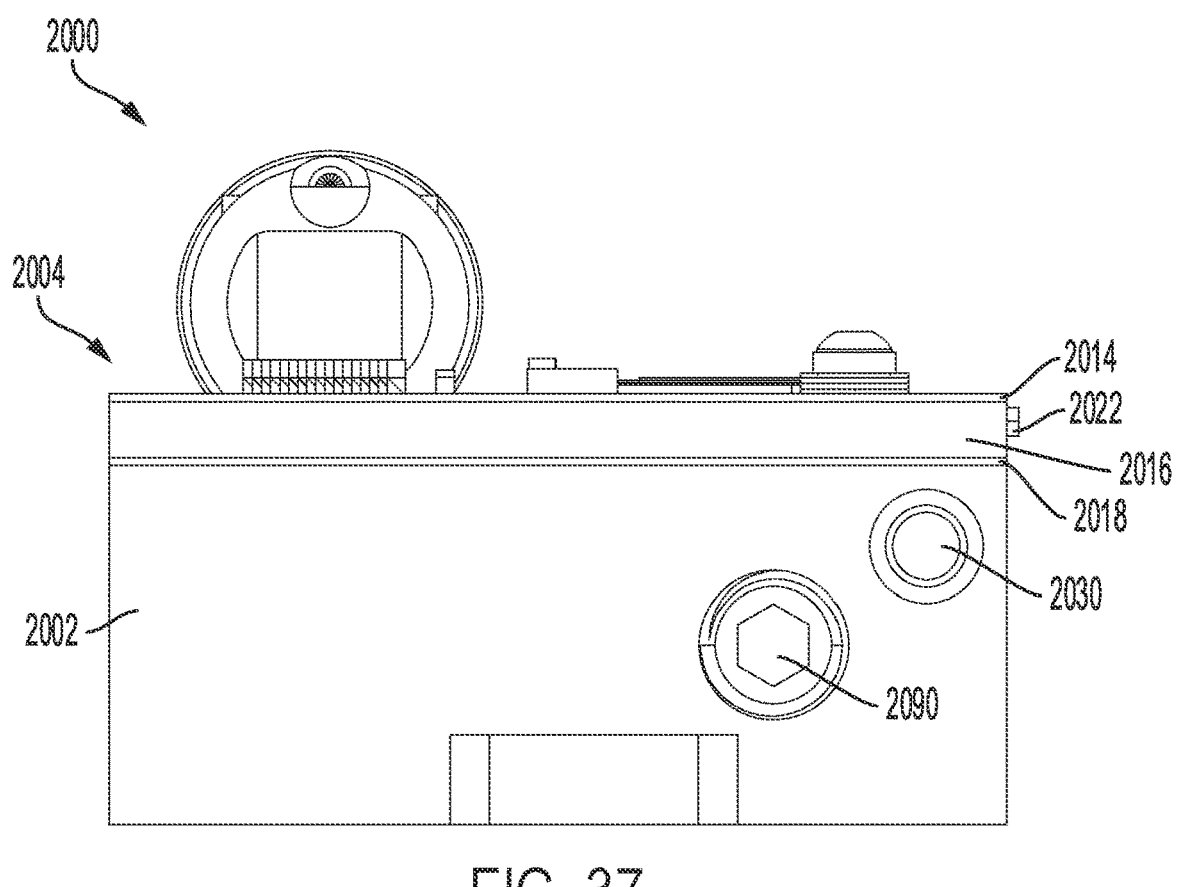
FIG. 37 is a front view of the diode laser pump module with a planar manifold structure.
Figure 38:
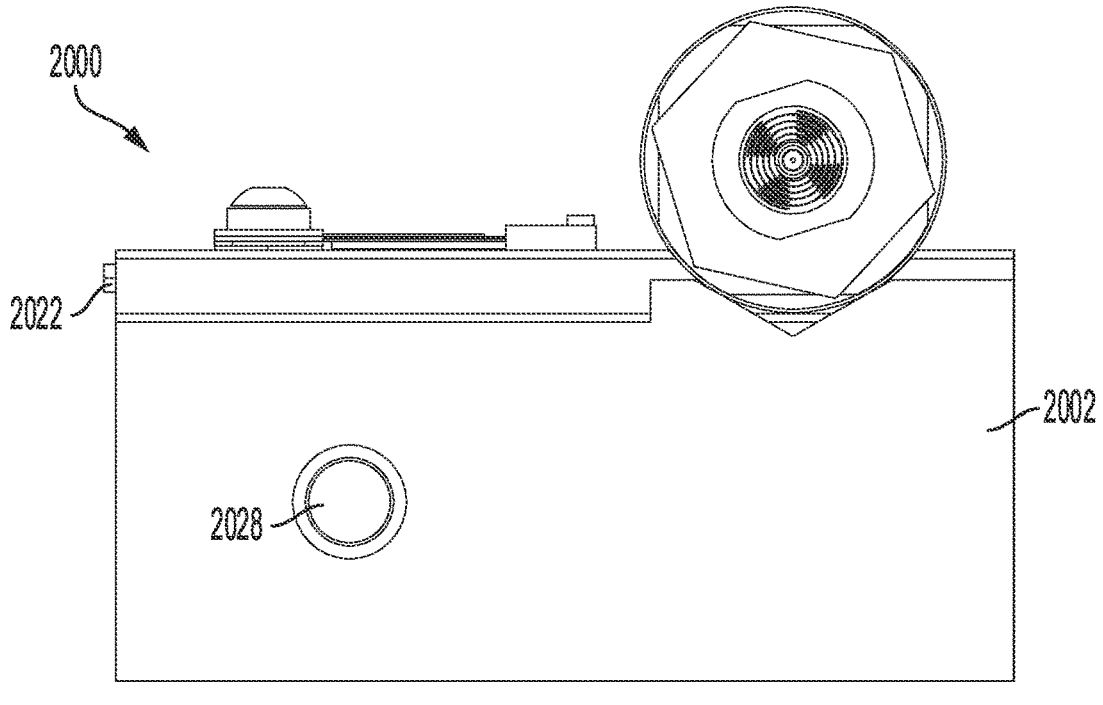
FIG. 38 is a back view of the diode laser pump module with a planar manifold structure.
Figures 39, 40:
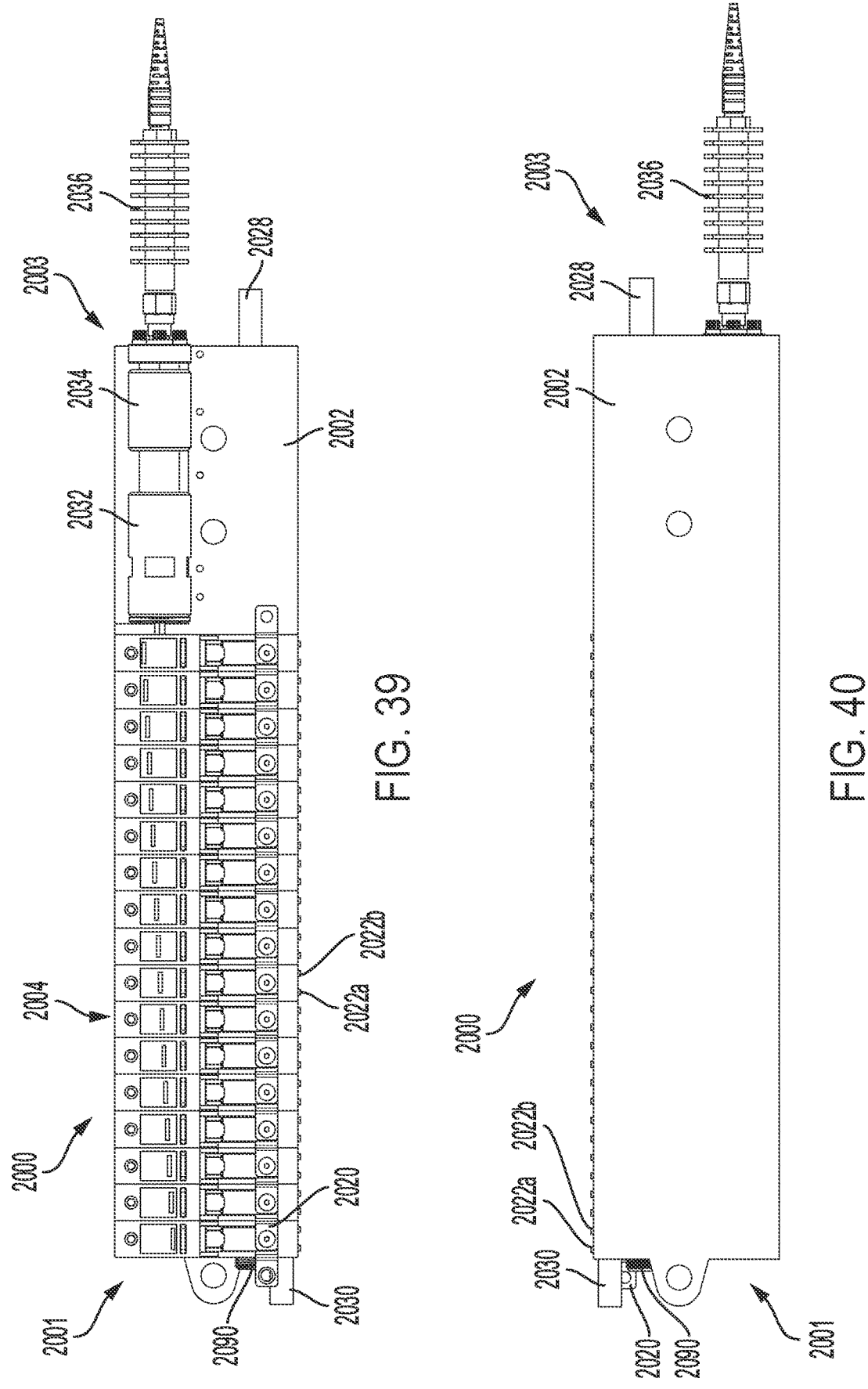
FIG. 39 is a top view of the diode laser pump module with a planar manifold structure.
FIG. 40 is a bottom view of the diode laser pump module with a planar manifold structure.

FIGS. 35 and 36 are side views of the diode laser pump module 2000 showing the substantially same plane configuration of the diode laser pump module 2000. FIGS. 37 and 38 are front and back views of the diode laser pump module 2000. FIG. 39 is a top view of the diode laser pump module 2000. The diode laser pump module 2000 comprises the substantially same plane manifold 2002. On the top surface of the substantially same plane manifold 2002 is the focuser relay barrel 2032, the relay barrel 2034, and the fiber connector mode stripper 2036. Also on the top surface of the substantially same plane manifold is the plurality of TOGPs 2004. FIG. 40 is the bottom view of the diode laser pump module 2000.

With reference now to FIGS. 35-40, at one end 2001 of the diode laser pump module 2000, the manifold outlet tube 2030 protrudes from the end of the substantially same plane manifold 2002. At an opposite end 2003 of the diode laser pump module 2000, the manifold inlet tube 2028 protrudes from the end of the substantially same plane manifold 2002. At the opposite end of the manifold outlet tube 2030 is a pressure pipe fitting 2090. The coolant is circulated through the substantially same plane manifold 2002 at a flowrate selected from a range of 0.1 gallons per minute (GPM) to 1.0 GPM and preferably less than 0.5 GPM while delivering an optical power greater than 500 Watts.

Figure 41:
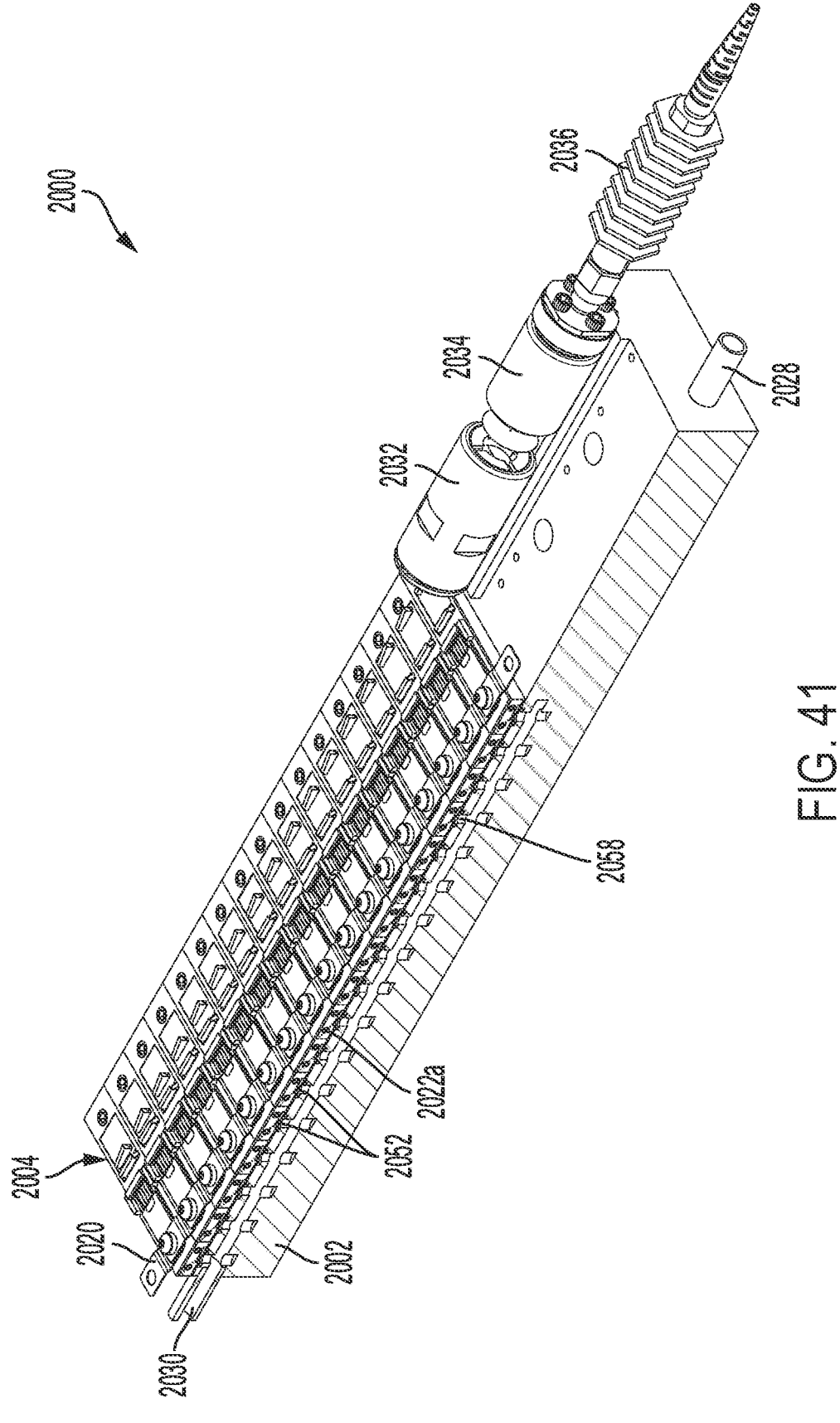
FIG. 41 is a cross-sectional perspective view of the diode laser pump module with a planar manifold structure through a tubing outlet tube.
Figures 42, 43:
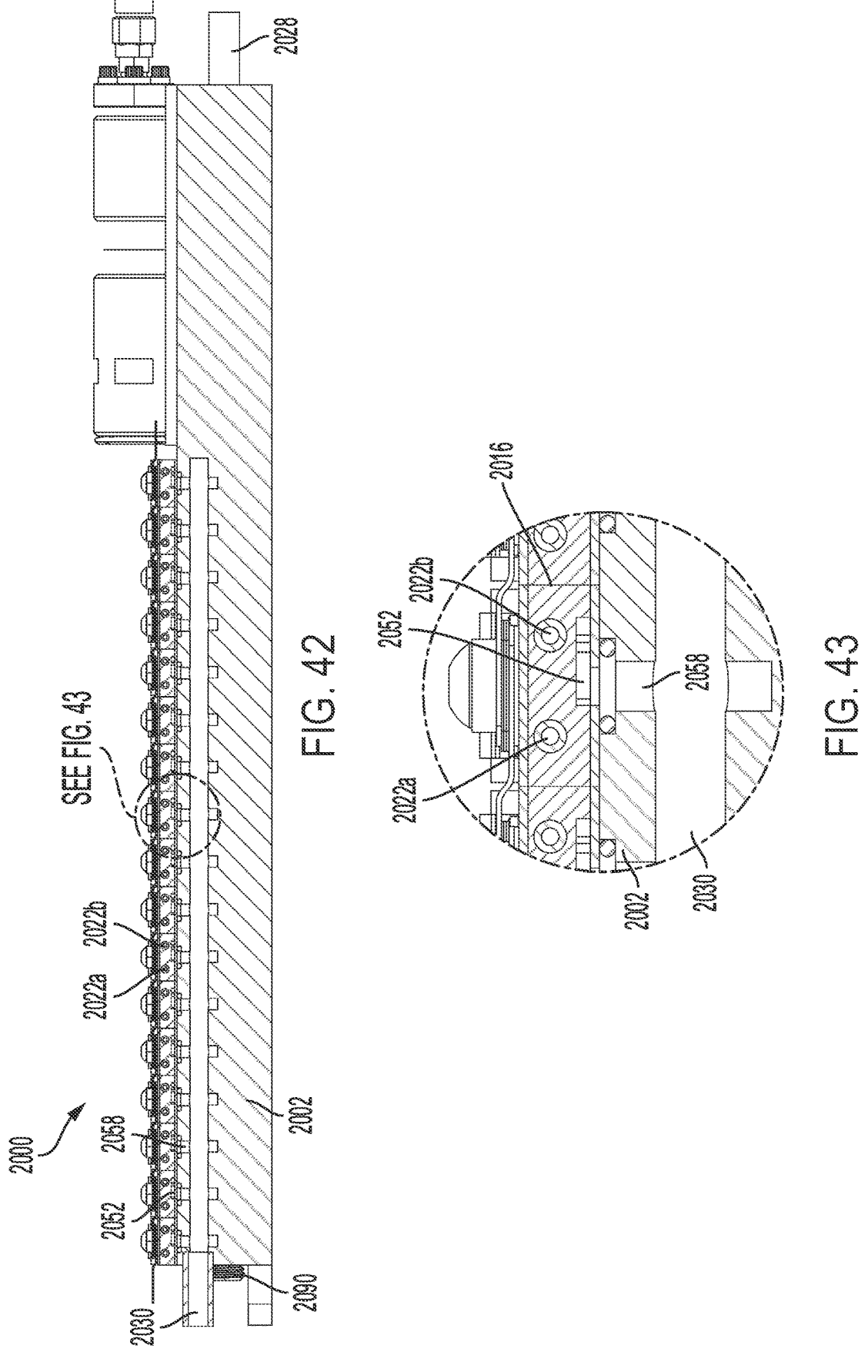
FIG. 42 is the cross-section of the diode laser pump module shown in FIG. 41 in a side view.
FIG. 43 is a magnified view of a portion of the diode laser pump module shown in FIG. 42.

FIG. 41 is a cross-sectional perspective view of the diode laser pump module 2000 shown in FIG. 24 taken through the manifold outlet tube 2030. FIG. 42 is the side view of the cross-section view of the diode laser pump module 2000 shown in FIG. 41. The manifold outlet tube 2030 connects to the plurality of substantially same plane manifold outlet channels 2058. The coolant exits the TOGP 2004 from the TOGP channel 2072 (see FIGS. 28-34) through an outlet channel 2052. The coolant then flows down the substantially same plane manifold outlet channel 2058 and into the manifold outlet tube 2030. The coolant then exits the manifold through the manifold outlet tube 2030.

FIG. 43 is a detailed view of FIG. 41 that illustrates the fluid connection between the manifold outlet 2030, the substantially same plane manifold outlet channels 2058, and the output channel 2052. Coolant fluid from the channel 2072 flows through the outlet channel 2052, exiting the TOGP 2004. The coolant then flows through the substantially same plane manifold outlet channels 2058 and into the manifold outlet tube 2030 where the coolant exits the diode laser pump module 2000.

FIG. 44 illustrates a cross-section of the diode laser pump module at the manifold inlet tube 2028. FIG. 45 is a side view of the cross-section of the diode laser pump module 2000, where the cross-section occurs at the manifold inlet tube 2028. The manifold inlet tube 2028 extends through the one end 2001 of the substantially same plane manifold 2002 to the other end 2003 of the substantially same plane manifold 2002. The manifold inlet tube 2028 stops at the compact pressure steel pipe fitting 2090. The pressure steel pipe fitting 2090 is connected to the one end 2001 of the manifold inlet tube 2028. As shown, the manifold inlet tube 2028 is fluidically coupled to a plurality of manifold inlet channels 2056. The manifold inlet channels 2056 are fluidically coupled to the manifold inlet tube 2028 of the inlet channel 2050.

The coolant flows through the inlet channel 2050 into each manifold inlet channels 2056. The coolant then flows through the inlet channel 2050 into the channels 2072 (see FIGS. 45-46) of each TOGP 2004 of the diode laser pump module 2000. The plurality of manifold inlet channels 2056 correspond to the plurality of TOGP 2004. Each of the plurality of manifold inlet channels 2056 connect to a corresponding inlet channel 2050 to facilitate the flow of coolant from the substantially same plane manifold 2002 to each channel 2072.

FIG. 46 is a detailed view of FIG. 45 that illustrates the fluid connection between the manifold inlet tube 2028, the manifold inlet channels 2056, and the inlet channel 2050. Coolant fluid from the manifold inlet tube 2028 flows into the manifold inlet channels 2056. The coolant fluid then flows from the manifold inlet channels 2056 through the corresponding inlet channel 2050. From there the coolant fluid flows through the corresponding channels 2072 of the individual TOGPs 2004.

In one aspect, the manifold inlet tube 2028 receives the coolant fluid and flows the coolant fluid through the manifold inlet tube 2028. The manifold inlet tube 2028 defines a plurality of manifold inlet channels 2056 that fluidically couple the manifold inlet tube 2028 to the channels 2072 of each of the plurality of TOGPs 2004. For example, the first TOGP 2004 is fluidically coupled to the manifold inlet tube 2028. The coolant fluid then flows into the manifold inlet channels 2056 and into the TOGP inlet channel 2050. The coolant fluid then flows through each of the TOGPs 2004 via the corresponding channels 2072. The coolant fluid exits the TOGP 2004 through the outlet channel 2052. The coolant fluid then flows down the substantially same plane manifold outlet channel 2058 and into the manifold outlet tube 2030. The coolant fluid then exits the diode laser pump module 2000 through the manifold outlet tube 2030.

Figure 47:
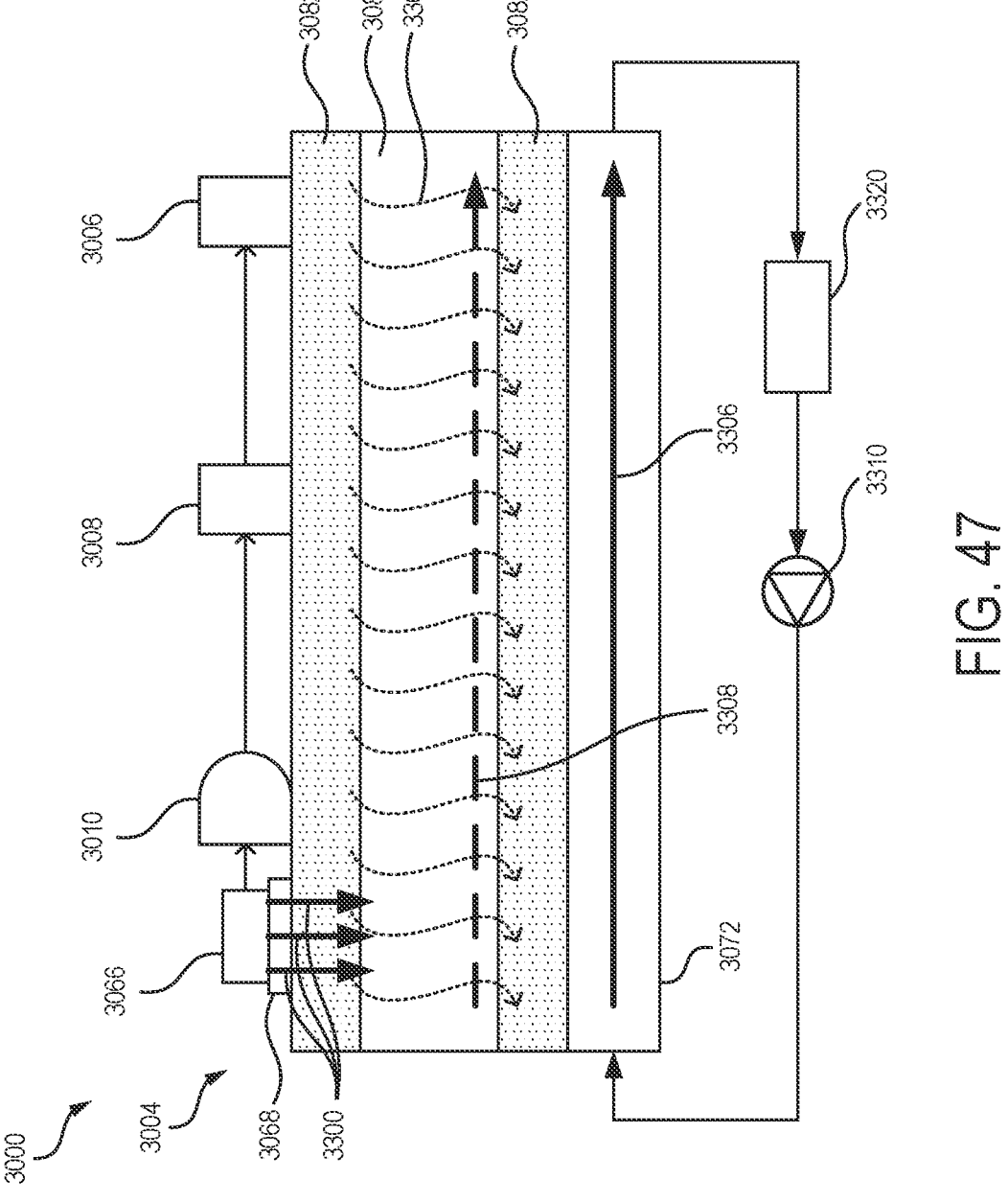
FIG. 47 is a functional block diagram of a diode laser pump module according to at least one aspect of the present disclosure.

FIG. 47 illustrates the heat transfer throughout the diode pump module 3000. FIG. 47 is a functional block diagram illustrating the heat transfer path in the TOGP 3004 and diode pump module 3000. On the surface of the TOGP 3004 is the sub-mount 3068, FAC 3010, SAC 3008, and turning prism 3006. The sub-mount 3068 is in thermal communication with the TOGP 3004. On the top surface of the sub-mount is the diode laser device 3066. The sub-mount 3068 and the diode laser device are in thermal communication. Within the TOGP 3004 is the evaporation chamber 3088 and the channel 3072. Within the evaporation chamber is the porous medium 3082a and 3082b. The porous medium 3082a and 3082b are saturated with working fluid. Coolant flows through the channel 3072.

During operation of the diode laser device 3066, the diode laser device 3066 generates heat 3300. The heat 3300 from the diode laser device 3066 is transferred to the diode laser sub-mount 3068 due to the diode laser 3066 being in thermal communication with the diode laser sub-mount 3068. The diode laser sub-mount is in thermal communication with the TOGP 3004. The heat is then transferred to the TOGP 3004 through the thermal connection between the sub-mount 3068 and the TOGP 3004. The working fluid within the evaporation chamber evaporates into a vapor 3304. The vapor 3304 spreads the heat over a surface area defined by the evaporation chamber 3088 that is a larger than the surface area of the laser diode device 3066. The vapor then condenses into porous medium 3082b above the channel 3072. In thermal communication with the evaporation chamber is the channel 3072. The channel circulates coolant 3306 through the channel 3072 via a pump 3310. The pump 3310 circulates the coolant throughout the diode pump module and dissipates the heat to system level heat exchanger 3320. The coolant circulates underneath the evaporation chamber 3088 to condense the vaporized working fluid and remove heat from the TOGP 3004.

Figure 48:
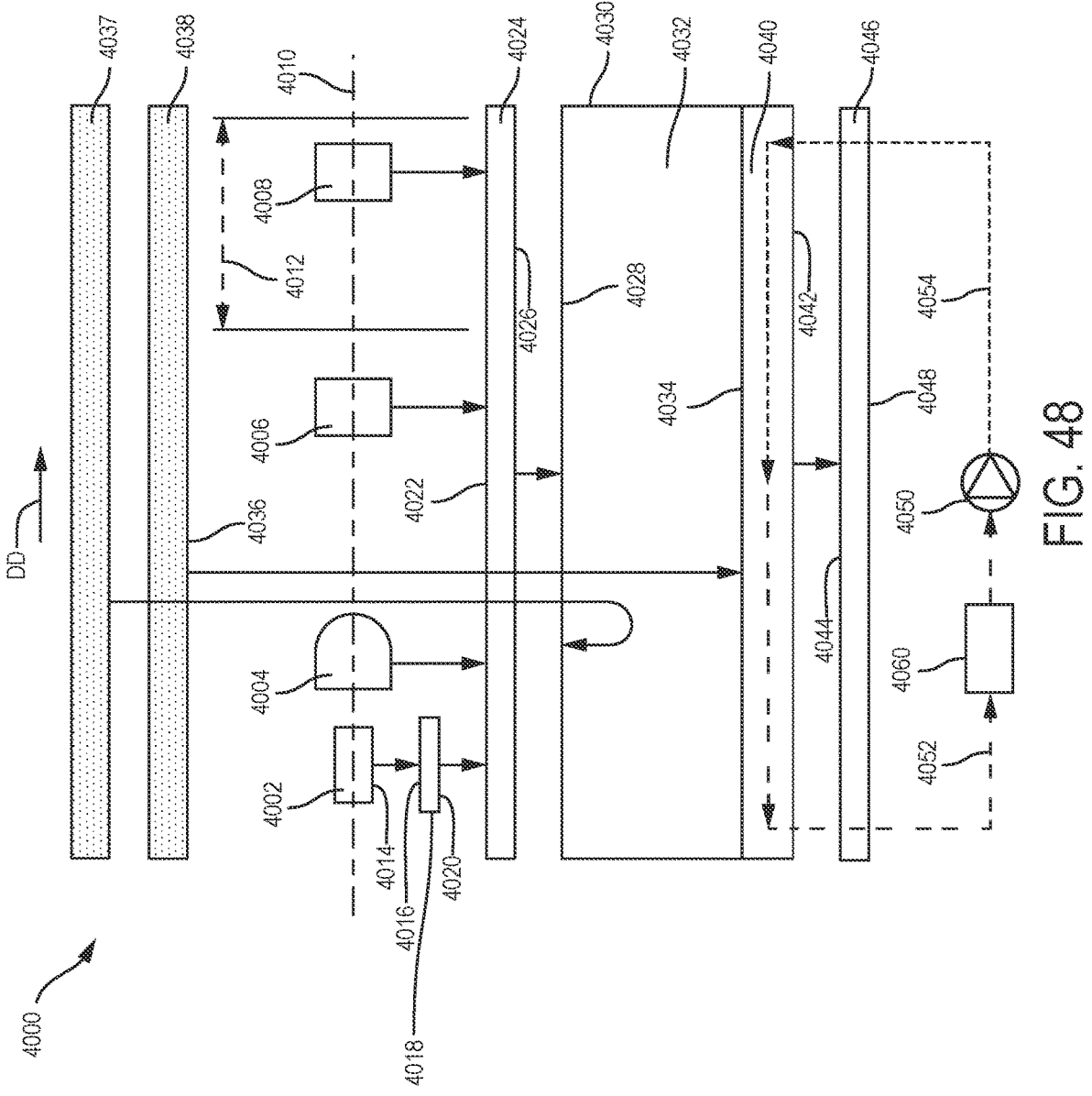
FIG. 48 is a schematic of one non-limiting example of a method of manufacturing a thermo-optical ground plane according to at least one aspect of the present disclosure.

There are many foreseeable ways to manufacture a thermo-optical ground plane 4000. FIG. 48 is a schematic of one non-limiting example. A side 4014 of a diode laser device 4002 is attached to a first side 4016 of a diode laser submount 4018. A second side 4020 of the diode laser submount 4018 is attached to a first side 4022 of a first plate 4024. The first side 4016 of the diode laser submount 4018 is opposite the second side 4020 of the diode laser submount 4018. The second side 4020 of the diode laser submount 4018 defines a first surface area. A fast axis collimator 4004 is attached to the first side 4022 of the first plate 4024 distal from the diode laser device 4002 in the distal direction DD. The fast axis collimator 4004 is in optical alignment 4010 with the diode laser device 4002. A slow axis collimator 4006 is attached to the first side 4022 of the first plate 4024 distal to the fast axis collimator 4004 in the distal direction DD. The slow axis collimator 4006 is in optical alignment 4010 with the diode laser device 4002. A turning prism 4008 is attached to the first side 4022 of the first plate 4024 distal to the fast axis collimator 4004 in the distal direction DD. The turning prism 4008 is in optical alignment 4010 with the diode laser device 4002. The turning prism 4008 may be attached to the first plate 4024 at any location within the distance 4012. In certain instances, the turning prisms 4008 for a plurality of thermo-optical ground planes 4000 may be placed in the same location on the first plate 4024. In other instances, each turning prism 4008 of a plurality of thermo-optical ground planes 4000 may be placed in different locations along the distance 4012 to allow all of the thermo-optical ground planes 4000 to not have overlapping optical paths.

Referring still to FIG. 48, a second side 4026 of the first plate 4024 is attached to a first side 4028 of a body 4030. An evaporation chamber 4032 is defined between the first plate 4024 and the body 4030. An interior wall of the evaporation chamber may be formed from part of the second side 4026 of the first plate 4024. The second side 4026 of the first plate 4024 is opposite the first side 4022 of the first plate 4024. The interior walls of the evaporation chamber define a surface area that is greater than the first surface area. A porous media 4038 is attached to an interior wall 4034 of the evaporation chamber 4032. The interior wall 4034 is opposite the interior wall formed from part of the second side 4026. A porous media 4037 is attached on an interior wall of the first side 4028 of the body 4030. During operation, the working fluid may evaporate from the porous media 4037 into the evaporation chamber 4032 and condense on the porous media 4038.

Referring still to FIG. 48, a second side 4042 of the body 4030 is attached to a first side 4044 of a second plate 4046. The second side 4042 of the body 4030 is opposite the first side 4028 of the body 4030. A channel 4040 is defined between the body 4030 and the second plate 4046. During use a coolant flows through the channel 4040. The coolant enters the second plate 4046 and then the channel 4040, circulates through the channel, and exits the channel and the second plate 4046. Alternatively, the coolant enters the second plate 4046 on a first end and leave through a second end, where the first end is on the opposite side of the channel 4040 from the second end. The channel is fluidically coupled to a pump 4050 that pumps the fluid along the inlet path 4052 and then to system level heat exchanger 4060 and further out the outlet path 4054. To attach the thermo-optical ground plane 4000 to another device, the second side 4048 of the second plate 4046 may be attached to that device. The second side 4048 of the second plate 4046 is opposite the first side 4044 of the second plate 4046.

Figure 49:
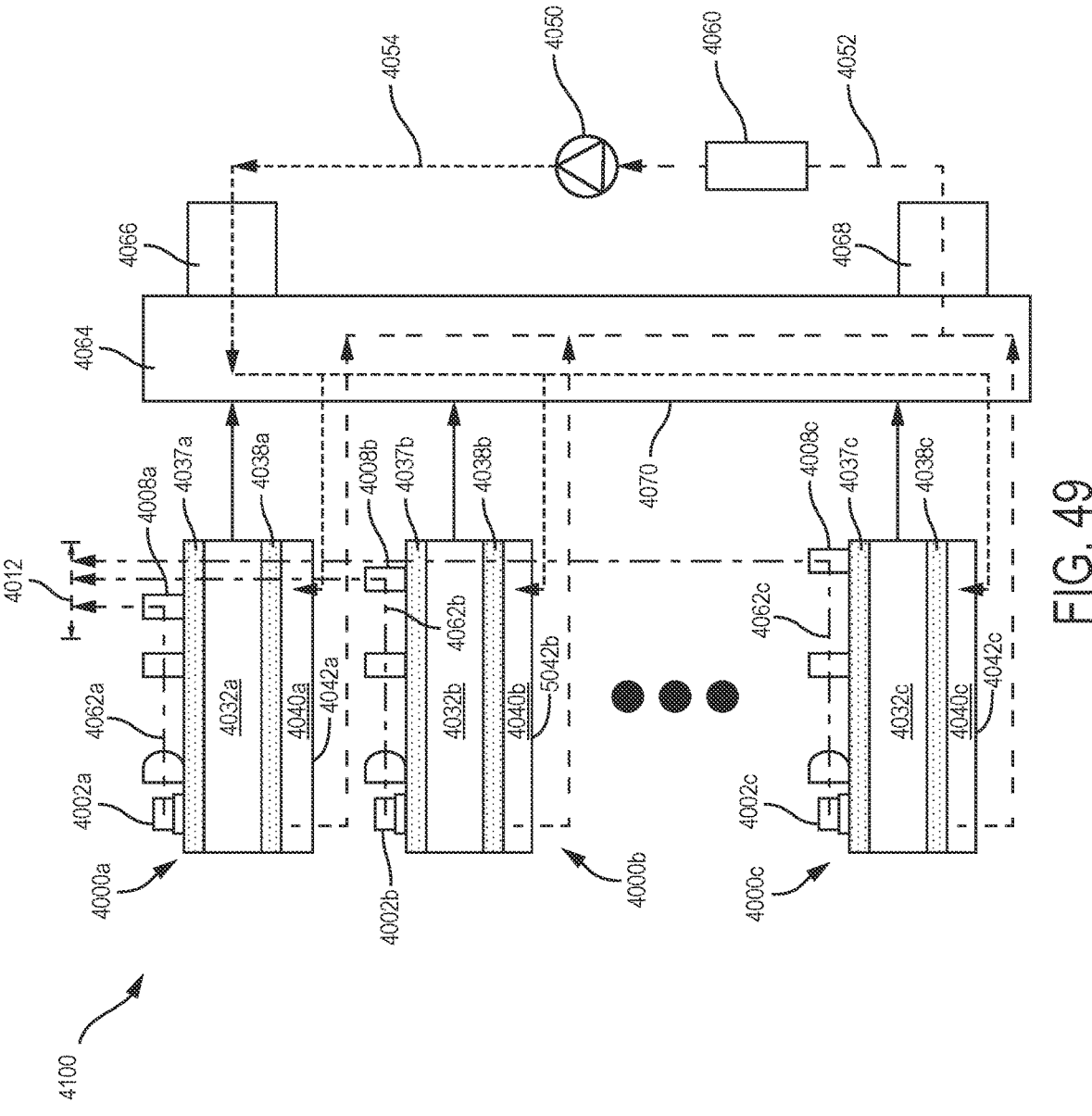
FIG. 49 is a schematic of one non-limiting example of a method of manufacturing a diode pump according to at least one aspect of the present disclosure.

There are many foreseeable ways to manufacture a diode pump module 4100. FIG. 49 is a schematic of one non-limiting example. A plurality of thermo-optical ground planes are attached to a flow manifold structure 4064. There can be any number of thermo-optical ground planes attached to the flow manifold structure 4064. For simplicity of the schematic, only 3 thermo-optical ground planes 4000a-c are shown. The thermo-optical ground planes 4000a-c are substantially similar to the thermo-optical ground plane 4000 in FIG. 48. The sides 4042a-c of the thermo-optical ground planes 4000a-c are attached to a side 4070 of the flow manifold structure 4064. In one instance, the side 4070 of the flow manifold structure 4064 is substantially planar. In this instance, the turning prisms 4008a-c are offset from each other within the distance 4012. These offsets provide the laser diode devices 4002a-c unobstructed optical paths 4062a-c, even though the thermo-optical ground planes a-c are all attached on one planar surface. In an alternative instance, the side 4070 of the flow manifold structure 4064 is a staircase structure. In the alternative instance, each thermo-optical ground plane 4000a-c is placed on a stair of the staircase structure and the height of the stairs provides unobstructed optical paths 4062a-c for the laser diode devices 4002*a-c*. Thus, in the alternative instance, the turning prisms 4008*a-c* may all be in the same location on the thermo-optical ground planes 4000*a-c* since an offset is created by the stair height.

Referring still to FIG. 49, the flow manifold structure 4064 defines a distribution manifold and a return manifold structure for the coolant fluid. The distribution manifold is fluidically coupled to an inlet to each channel 4040*a-c* and the return manifold is fluidically coupled to an outlet of each channel 4040*a-c*. A common manifold inlet 4066 is attached to the distribution manifold and a common manifold outlet 4068 is attached to the return manifold. A pump 4050 is fluidically coupled to the common manifold inlet 4066 and common manifold outlet 4068. A coolant is pumped from the pump 4050 along the fluid inlet path 4052 to system level heat exchanger 4060. The fluid is further pumped along the inlet path 4054 and into the common manifold inlet through the distribution manifold and to the inlet of each channel 4040*a-c*. The coolant passes through the channels 4040*a-c* from the first end to the second end. The coolant leaves the channels 4040*a-c* through the second end and flows along the fluid outlet path 4052. The fluid outlet path 4052 leaves through the outlet of the channels 4040*a-c* and enters into the return manifold. The fluid outlet path 4052 then goes through the return manifold and exits at the common manifold outlet and enters back into the system level heat exchanger 4060 and the pump 4050. In use, coolant continues to circulate from the pump 4050 to the one of the channels 4040*a-c* and then back to the pump 4050.

Various aspects of the subject matter described herein are set out in the following numbered clauses. An aspect of the method or apparatus may include any one or more than one, and any combination of, the clauses described below.

Clause 1. A thermo-optical ground plane, comprising: a first plate configured to mount a diode laser device defining a first surface area; a second plate; a body positioned between the first and second plates, the body comprising a plurality of structural elements to support the first and second plates; an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant.

Clause 2. The thermo-optical ground plane of Clause 1, further comprising a first tube and a second tube wherein the first tube and the second tube are configured to introduce the working fluid to the evaporation chamber and by terminating both tubes to seal the evaporation chamber and to contain the working fluid within the evaporation chamber, wherein the working fluid is a degassed fluid.

Clause 3. The thermo-optical ground plane of any one of Clauses 1-2, wherein the porous medium is on inner walls of the evaporation chamber that receives working fluid and that transfers the working fluid by capillary action during the operation of the thermo-optical ground plane of claim 1.

Clause 4. The thermo-optical ground plane of any one of Clauses 1-3, wherein the working fluid is configured to vaporize with the application of heat to transfer the heat to the second surface area defined by the inner walls of the evaporation chamber.

Clause 5. The thermo-optical ground plane of any one of Clauses 1-4, further comprising a diode laser device mounted to the first plate.

Clause 6. The thermo-optical ground plane of any one of Clauses 1-5, further comprising a sub-mount plate disposed between the first plate and the laser diode device, wherein the sub-mount plate is electrically isolative and is in thermal communication with the laser diode device and the first plate.

Clause 7. The thermo-optical ground plane of any one of Clauses 1-6, wherein the sub-mount plate is high thermal conductivity electrically isolative ceramics such as beryllium oxide or aluminum nitride that includes a layer of copper on each side and is electroplated with nickel and gold Clause 8. The thermo-optical ground plane of any one of Clauses 1-7, further comprising an optical device attached to the first plate, wherein the optical device is in optical communication with an output of the diode laser device.

Clause 9. The thermo-optical ground plane of any one of Clauses 1-8, wherein the optical device comprises a fast axis collimator, a slow axis collimator, a prism, or a mirror, or any combination thereof.

Clause 10. The thermo-optical ground plane of any one of Clauses 1-9, wherein the optical device is attached to the first plate with adhesive.

Clause 11. The thermo-optical ground plane of any one of Clauses 1-10, wherein the adhesive comprises epoxy, ultraviolet (UV) curable epoxy, solder, or indium solder, or any combination thereof.

Clause 12. The thermo-optical ground plane of any one of Clauses 1-11, wherein the first plate comprises a plurality of alignment elements to optically align the optical device, wherein the plurality of alignment elements comprises mechanical stops, corners, slider edges, or pockets, or any combination thereof.

Clause 13. The thermo-optical ground plane of any one of Clauses 1-12, wherein the plurality of structural elements comprise posts to stiffen the first plate.

Clause 14. The thermo-optical ground plane of any one of Clauses 1-13, wherein the channel defines a width selected from a range from 0.5 mm to 2.0 mm to enable clog free operation.

Clause 15. The thermo-optical ground plane of any one of Clauses 1-14, wherein the coolant is propylene-glycol-water.

Clause 16. A diode pump module comprising: a plurality of thermo-optical ground planes, wherein each of the plurality of thermo-optical ground planes comprises: a first plate defining a first surface area, the first plate configured to mount a diode laser device defining a first surface area; a second plate; a body positioned between the first and second plates, the body comprising a plurality of structural elements to support the first and second plates; an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant; a diode laser device mounted on the first plate; and an optical device attached to the first plate, wherein the optical device is in optical communication with an output of the diode laser device; a flow manifold structure configured to connect each of the plurality of thermo-optical ground planes in a predetermined configuration to combine optical power from the plurality of diode laser devices and to couple the combined optical power to a single optical fiber, the flow manifold structure comprising: a manifold inlet tube configured to receive the coolant; a distribution manifold fluidically coupled to the manifold inlet and fluidically coupled to each channel of the plurality of thermo-optical ground planes; a return manifold fluidically coupled to each channel of the plurality of thermo-optical ground planes; and a common manifold outlet fluidically coupled to the return manifold.

Clause 17. The diode pump module of Clause 16, wherein the diode pump module defines a staircase structure configuration.

Clause 18. The diode pump module of any one of Clauses 16-17, wherein the diode pump module defines a substantially planar structure configuration.

Clause 19. The diode pump module of any one of Clauses 16-18, wherein the optical device comprises a fast axis collimator, a slow axis collimator, a rotating prism, or any combination thereof.

Clause 20. The diode pump module of any one of Clauses 16-19, wherein the flow manifold is configured to uniformly distribute the coolant to the plurality of thermo-optical ground planes.

Clause 21. The diode pump module of any one of Clauses 16-20, wherein the coolant comprises propylene-glycol-water.

Clause 22. The diode pump module of any one of Clauses 16-21, wherein the coolant is circulated at a flowrate selected from a range of 0.1 gallons per minute (GPM) to 1.0 GPM.

Clause 23. The diode pump module of any one of Clauses 16-22, wherein the diode pump module is configured to combine light from the plurality diode laser devices.

Clause 24. The diode pump module of any one of Clauses 16-23, wherein the diode pump module has specific volume of less than 0.7 cubic-centimeter/Watt and specific weight of less than 0.7 gram/Watt and is configured to deliver an optical power greater than 500 Watts.

Clause 25. The diode pump module of any one of Clauses 16-24, wherein the plurality of diode laser devices are configured to couple the combined optical power to a single optical fiber having a core that is selected from a range of 100 μm to 225 μm with a numerical aperture less than 0.22.

Clause 26. A thermo-optical ground plane, comprising: a plate configured to mount a diode laser device defining a first surface area; an evaporation chamber in thermal communication with the plate, wherein the evaporation chamber is configured to receive a working fluid, and wherein inner walls of the evaporation chamber define a second surface area that is greater than the first surface area of the diode laser device; and a channel defined in thermal communication with the evaporation chamber, wherein the channel is configured to receive and circulate a coolant fluid at a predetermined flowrate.

Clause 27. The thermo-optical ground plane of Clauses 26, wherein the evaporation chamber further comprising a porous medium on inner walls to hold and transport the working fluid by capillary action.

Clause 28. The thermo-optical ground plane of any one of Clauses 26-27, further comprising a diode laser device mounted to the first plate.

Clause 29. The thermo-optical ground plane of any one of Clauses 26-28, further comprising a sub-mount plate disposed between the first plate and the laser diode device, wherein the sub-mount plate is electrically isolative and is in thermal communication with the laser diode device and the first plate.

Clause 30. The thermo-optical ground plane of any one of Clauses 26-29, further comprising an optical device attached to the first plate, wherein the optical device is in optical communication with an output of the diode laser device.

Clause 31. The thermo-optical ground plane of any one of Clauses 26-30, wherein the optical device comprises a fast axis collimator, a slow axis collimator, a prism, or a mirror, or any combination thereof.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present disclosure has been described with reference to various exemplary and illustrative aspects. The aspects described herein are understood as providing illustrative features of varying detail of various aspects of the present disclosure; and therefore, unless otherwise specified, it is to be understood that, to the extent possible, one or more features, elements, components, constituents, ingredients, structures, modules, and/or aspects of the disclosed aspects may be combined, separated, interchanged, and/or rearranged with or relative to one or more other features, elements, components, constituents, ingredients, structures, modules, and/or aspects of the disclosed aspects without departing from the scope of the present disclosure. Accordingly, it will be recognized by persons having ordinary skill in the art that various substitutions, modifications or combinations of any of the exemplary aspects may be made without departing from the scope of the present disclosure. In addition, persons skilled in the art will recognize, or be able to ascertain using no more than routine experimentation, many equivalents to the various aspects of the present disclosure upon review of this specification. Thus, the present disclosure is not limited by the description of the various aspects, but rather by the claims.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although claim recitations are presented in a sequence(s), it should be understood that the various operations may be performed in other orders than those which are described, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect.

Furthermore, the particular features, structures or characteristics may be combined in any suitable manner in one or more aspects.

As used herein, the singular form of "a", "an", and "the" include the plural references unless the context clearly dictates otherwise.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

The terms "about" or "approximately" as used in the present disclosure, unless otherwise specified, means an acceptable error for a particular value as determined by one of ordinary skill in the art, which depends in part on how the value is measured or determined. In certain aspects, the term "about" or "approximately" means within 1, 2, 3, or 4 standard deviations. In certain aspects, the term "about" or "approximately" means within 50%, 200%, 105%, 100%, 9%, 8%, 7%, 6%, 5%, 4%, 3%, 2%, 1%, 0.5%, or 0.05% of a given value or range.

In this specification, unless otherwise indicated, all numerical parameters are to be understood as being prefaced and modified in all instances by the term "about," in which the numerical parameters possess the inherent variability characteristic of the underlying measurement techniques used to determine the numerical value of the parameter. At the very least, and not as an attempt to limit the application of the doctrine of equivalents to the scope of the claims, each numerical parameter described herein should at least be construed in light of the number of reported significant digits and by applying ordinary rounding techniques.

Any numerical range recited herein includes all sub-ranges subsumed within the recited range. For example, a range of "1 to 100" includes all sub-ranges between (and including) the recited minimum value of 1 and the recited maximum value of 100, that is, having a minimum value equal to or greater than 1 and a maximum value equal to or less than 100. Also, all ranges recited herein are inclusive of the end points of the recited ranges. For example, a range of "1 to 100" includes the end points 1 and 100. Any maximum numerical limitation recited in this specification is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited. All such ranges are inherently described in this specification.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system that "comprises," "has," "includes" or "contains" one or more elements possesses those one or more elements, but is not limited to possessing only those one or more elements. Likewise, an element of a system, device, or apparatus that "comprises," "has," "includes" or "contains" one or more features possesses those one or more features, but is not limited to possessing only those one or more features.

Unless specifically stated otherwise as apparent from the foregoing disclosure, it is appreciated that, throughout the foregoing disclosure, discussions using terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

It will thus be seen that the aspects set forth above, among those made apparent from the preceding description, are efficiently attained and, because certain changes may be made in carrying out the above method and in the construction(s) set forth without departing from the scope of the present disclosure, it is intended that all matter contained in the above description and shown in the accompanying drawings shall be interpreted as illustrative and not in a limiting sense.

It is also to be understood that the following claims are intended to cover all of the generic and specific features of the present disclosure and all statements of the scope of the present disclosure which, as a matter of language, might be said to fall therebetween.

The invention claimed is:

1. A thermo-optical ground plane, comprising:
a first plate configured to mount a diode laser device defining a first surface area;
a second plate;
a body positioned between the first and second plates, the body comprising a plurality of posts to support the first and second plates and to stiffen the first plate;
an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and
a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant.

2. The thermo-optical ground plane of claim 1, further comprising a first tube and a second tube wherein the first tube and the second tube are configured to introduce the working fluid to the evaporation chamber and by terminating both tubes to seal the evaporation chamber and to contain the working fluid within the evaporation chamber, wherein the working fluid is a degassed fluid.

3. The thermo-optical ground plane of claim 1, wherein the porous medium is on the inner walls of the evaporation chamber that receives working fluid and that transfers the working fluid by capillary action during the operation of the thermo-optical ground plane of claim 1.

4. The thermo-optical ground plane of claim 1, wherein the working fluid is configured to vaporize with the application of heat to transfer the heat to the second surface area defined by the inner walls of the evaporation chamber.

5. The thermo-optical ground plane of claim 1, further comprising the diode laser device mounted to the first plate.

6. The thermo-optical ground plane of claim 5, further comprising a sub-mount plate disposed between the first plate and the laser diode device, wherein the sub-mount plate is electrically isolative and is in thermal communication with the laser diode device and the first plate.

7. The thermo-optical ground plane of claim 6, wherein the sub-mount plate is high thermal conductivity electrically isolative ceramics such as beryllium oxide or aluminum nitride that includes a layer of copper on each side and is electroplated with nickel and gold.

8. The thermo-optical ground plane of claim 5, further comprising an optical device attached to the first plate, wherein the optical device is in optical communication with an output of the diode laser device.

9. The thermo-optical ground plane of claim 8, wherein the optical device comprises a fast axis collimator, a slow axis collimator, a prism, or a mirror, or any combination thereof.

10. The thermo-optical ground plane of claim 8, wherein the optical device is attached to the first plate with adhesive.

11. The thermo-optical ground plane of claim 10, wherein the adhesive comprises epoxy, ultraviolet (UV) curable epoxy, solder, or indium solder, or any combination thereof.

12. The thermo-optical ground plane of claim 8, wherein the first plate comprises a plurality of alignment elements to optically align the optical device, wherein the plurality of alignment elements comprises mechanical stops, corners, slider edges, or pockets, or any combination thereof.

13. The thermo-optical ground plane of claim 1, wherein the channel defines a width selected from a range from 0.5 mm to 2.0 mm to enable clog free operation.

14. The thermo-optical ground plane of claim 1, wherein the coolant is propylene-glycol-water.

15. A diode pump module comprising:
a plurality of thermo-optical ground planes, wherein each of the plurality of thermo-optical ground planes comprises:

a diode laser device;

a first plate configured to mount the diode laser device defining a first surface area;

a second plate;

a body positioned between the first and second plates, the body comprising a plurality of posts to support the first and second plates and to stiffen the first plate;

an evaporation chamber defined between the body and the first plate, wherein the evaporation chamber is configured to receive a working fluid, the evaporation chamber comprising a porous medium to hold the working fluid, wherein the evaporation chamber and the first plate are in thermal communication to transfer heat from the evaporation chamber to the first surface area of the first plate, and wherein inner walls of the evaporation chamber define a second surface area that is greater than the first surface area of the diode laser device; and a channel defined between the body and the second plate, wherein the channel is configured to receive and circulate a coolant at a predetermined flowrate, the channel positioned adjacent to and in thermal communication with the evaporation chamber to transfer heat from the evaporation chamber to the circulating coolant;

and an optical device attached to the first plate, wherein the optical device is in optical communication with an output of the diode laser device; and a flow manifold structure configured to connect each of the plurality of thermo-optical ground planes in a predetermined configuration to combine optical power from each of the diode laser devices of the plurality of thermo-optical ground planes and to couple the combined optical power to a single optical fiber, the flow manifold structure comprising:

a manifold inlet tube configured to receive the coolant;

a distribution manifold fluidically coupled to the manifold inlet tube and fluidically coupled to each channel of the plurality of thermo-optical ground planes;

a return manifold fluidically coupled to each channel of the plurality of thermo-optical ground planes; and a common manifold outlet fluidically coupled to the return manifold.

16. The diode pump module of claim 15, wherein the diode pump module defines a staircase structure configuration.

17. The diode pump module of claim 15, wherein the diode pump module defines a substantially planar structure configuration.

18. The diode pump module of claim 15, wherein the optical device comprises a fast axis collimator, a slow axis collimator, a rotating prism, or any combination thereof.

19. The diode pump module of claim 15, wherein the flow manifold structure is configured to uniformly distribute the coolant to the plurality of thermo-optical ground planes.

20. The diode pump module of claim 15, wherein the coolant comprises propylene-glycol-water.

21. The diode pump module of claim 15, wherein the coolant is circulated at a flowrate selected from a range of 0.1 gallons per minute (GPM) to 1.0 GPM.

22. The diode pump module of claim 15, wherein the diode pump module is configured to combine light from each of the diode laser devices of the plurality of thermo-optical ground planes.

23. The diode pump module of claim 15, wherein the diode pump module has specific volume of less than 0.7 cubic-centimeter/Watt and specific weight of less than 0.7 gram/Watt and is configured to deliver an optical power greater than 500 Watts.

24. The diode pump module of claim 15, wherein each of the diode laser devices of the plurality of thermo-optical ground planes are configured to couple the combined optical power to a single optical fiber having a core that is selected from a range of 100 μm to 225 μm with a numerical aperture less than 0.22.

25. A thermo-optical ground plane, comprising:

a first plate configured to mount a diode laser device defining a first surface area;

a second plate; and a body positioned between the first and second plates, the body defining:

a plurality of posts to stiffen the first plate;

an evaporation chamber in thermal communication with the first plate, wherein the evaporation chamber is configured to receive a working fluid, and wherein inner walls of the evaporation chamber define a second surface area that is greater than the first surface area of the diode laser device; and a channel defined in thermal communication with the evaporation chamber, wherein the channel is configured to receive and circulate a coolant fluid at a predetermined flowrate, wherein the evaporation chamber and the channel are fluidically isolated.

26. The thermo-optical ground plane of claim 25, wherein the evaporation chamber further comprising a porous medium on the inner walls to hold and transport the working fluid by capillary action.

27. The thermo-optical ground plane of claim 26, further comprising an optical device attached to the first plate, wherein the optical device is in optical communication with an output of the diode laser device.

28. The thermo-optical ground plane of claim 27, wherein the optical device comprises a fast axis collimator, a slow axis collimator, a prism, or a mirror, or any combination thereof.

29. The thermo-optical ground plane of claim 25, further comprising the diode laser device mounted to the first plate.

30. The thermo-optical ground plane of claim 29, further comprising a sub-mount plate disposed between the first plate and the laser diode device, wherein the sub-mount plate is electrically isolative and is in thermal communication with the laser diode device and the first plate.

*   *   *   *   *